United States Patent
Yokogawa

(10) Patent No.: US 10,983,339 B2
(45) Date of Patent: Apr. 20, 2021

(54) SOLID-STATE IMAGING ELEMENT, PUPIL CORRECTION METHOD FOR SOLID-STATE IMAGING ELEMENT, IMAGING DEVICE, AND INFORMATION PROCESSING DEVICE

(71) Applicant: SONY CORPORATION, Tokyo (JP)

(72) Inventor: Sozo Yokogawa, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 21 days.

(21) Appl. No.: 16/322,335

(22) PCT Filed: Aug. 1, 2017

(86) PCT No.: PCT/JP2017/027862
§ 371 (c)(1),
(2) Date: Jan. 31, 2019

(87) PCT Pub. No.: WO2018/030213
PCT Pub. Date: Feb. 15, 2018

(65) Prior Publication Data
US 2019/0196183 A1    Jun. 27, 2019

(30) Foreign Application Priority Data
Aug. 9, 2016 (JP) .............................. JP2016-156463

(51) Int. Cl.
*H01L 31/0232* (2014.01)
*G02B 27/00* (2006.01)
(Continued)

(52) U.S. Cl.
CPC ....... *G02B 27/0081* (2013.01); *G02B 3/0068* (2013.01); *G02B 5/201* (2013.01);
(Continued)

(58) Field of Classification Search
CPC .... G02B 27/0081; G02B 5/201; G02B 5/204; G02B 13/16; G02B 3/0068; G02B 5/22;
(Continued)

(56) References Cited

U.S. PATENT DOCUMENTS

2009/0147101 A1* 6/2009 Tatani ............... H01L 27/14621
348/224.1
2011/0128405 A1   6/2011 Handa
(Continued)

FOREIGN PATENT DOCUMENTS

| JP | H06-140609 | 5/1994 |
|----|------------|--------|
| JP | 2008-177191 | 7/2008 |

(Continued)

OTHER PUBLICATIONS

International Search Report prepared by the Japan Patent Office dated Sep. 5, 2017, for International Application No. PCT/JP2017/027862.

(Continued)

*Primary Examiner* — Robert G Bachner
(74) *Attorney, Agent, or Firm* — Sheridan Ross P.C.

(57) ABSTRACT

To suppress the reduction in transmission efficiency due to the change of the chief ray angle in spite of using structural color filters. A solid-state imaging element includes: a light receiving element included in a plurality of pixels; structural color filters located above at least part of the light receiving element and each including a metal film a periodic opening pattern with a structural period smaller than a prescribed wavelength; and an interconnection layer located below the light receiving element and configured to acquire a signal of light detected by the light receiving element. The structural period is different between the structural color filters in accordance with a chief ray angle of incident light, and the structural period of the periodic opening pattern becomes
(Continued)

smaller as the chief ray angle becomes larger, relative to the structural period of the periodic opening pattern at the chief ray angle of 0°.

21 Claims, 26 Drawing Sheets

(51) Int. Cl.
| | |
|---|---|
| *H04N 5/374* | (2011.01) |
| *H04N 9/07* | (2006.01) |
| *G02B 5/20* | (2006.01) |
| *H01L 27/146* | (2006.01) |
| *G02B 13/16* | (2006.01) |
| *G02B 3/00* | (2006.01) |
| *H04N 9/04* | (2006.01) |
| *G02B 5/22* | (2006.01) |

(52) U.S. Cl.
CPC ............... *G02B 5/204* (2013.01); *G02B 5/22* (2013.01); *G02B 13/16* (2013.01); *H01L 27/1463* (2013.01); *H01L 27/14621* (2013.01); *H01L 27/14623* (2013.01); *H01L 27/14627* (2013.01); *H01L 27/14636* (2013.01); *H04N 5/374* (2013.01); *H04N 9/0455* (2018.08); *H04N 9/07* (2013.01)

(58) Field of Classification Search
CPC ........ G02B 5/008; G02B 1/002; H04N 5/374; H04N 9/07; H04N 9/0455; H01L 27/1463; H01L 27/14623; H01L 27/14621; H01L 27/14627; H01L 27/14636

See application file for complete search history.

(56) References Cited

U.S. PATENT DOCUMENTS

| | | | |
|---|---|---|---|
| 2013/0057738 A1* | 3/2013 | Konno | ................ G02B 5/203 348/294 |
| 2014/0146207 A1* | 5/2014 | Yokogawa | ............. G02B 5/201 348/281 |
| 2016/0211388 A1* | 7/2016 | Natsuaki | ........... H01L 27/14629 |
| 2017/0127024 A1* | 5/2017 | Yokogawa | ........ H01L 27/14625 |

FOREIGN PATENT DOCUMENTS

| | | |
|---|---|---|
| JP | 2009-158944 | 7/2009 |
| JP | 2010-170085 | 8/2010 |
| JP | 2013-030626 | 2/2013 |
| JP | 2013-055202 | 3/2013 |
| JP | 2015-232599 | 12/2015 |
| WO | WO 2015/025637 | 2/2015 |

OTHER PUBLICATIONS

Burgos et al., "Color Imaging via Nearest Neighbor Hole Coupling in Plasmonic Color Filters Integrated onto a Complementary Metal-Oxide Semiconductor Image Sensor," ACS Nano, vol. 7, No. 11, 2013, pp. 10038-10047.
Yokogawa et al., "Plasmonic Color Filters for CMOS Image Sensor Applications," Nano Letters, vol. 12, No. 8, 2012, pp. 4349-4354.

* cited by examiner h = 1000 nm h = 0 nm

| G1 | B1 | G2 | B2 |
|----|----|----|----|
| R1 | G5 | R2 | G6 |
| G3 | B3 | G4 | B4 |
| R3 | G7 | R4 | G8 |

FIG. 27B

| A | A | M | B | C | C | O | D |
|---|---|---|---|---|---|---|---|
| E | A | G | B | I | C | K | D |
| I | E | E | F | K | G | G | M |
| L | E | M | F | N | G | O | M |
| D | C | P | D | B | A | N | B |
| I | C | K | D | E | A | G | B |
| L | G | H | M | J | E | F | F |
| N | G | O | M | L | E | M | F |

FIG. 27C

| w | b | w | b | w | b | w | b |
|---|---|---|---|---|---|---|---|
| r | g | r | g | r | g | r | g |
| w | b | w | b | w | b | w | b |
| r | g | r | g | r | g | r | g |
| w | b | w | b | w | b | w | b |
| r | g | r | g | r | g | r | g |
| w | b | w | b | w | b | w | b |
| r | g | r | g | r | g | r | g |

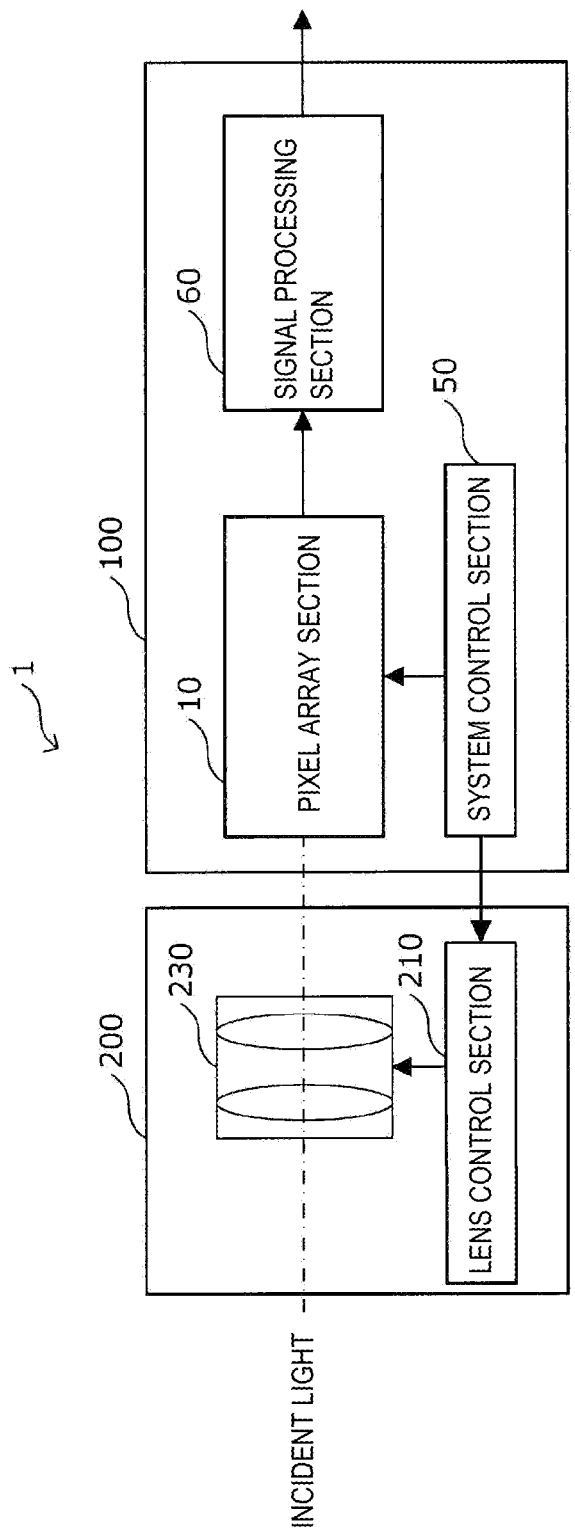

SOLID-STATE IMAGING ELEMENT, PUPIL CORRECTION METHOD FOR SOLID-STATE IMAGING ELEMENT, IMAGING DEVICE, AND INFORMATION PROCESSING DEVICE

CROSS REFERENCE TO RELATED APPLICATIONS

This application is a national stage application under 35 U.S.C. 371 and claims the benefit of PCT Application No. PCT/JP2017/027862 having an international filing date of 1 Aug. 2017, which designated the United States, which PCT application claimed the benefit of Japanese Patent Application No. 2016-156463 filed 9 Aug. 2016, the entire disclosures of each of which are incorporated herein by reference.

TECHNICAL FIELD

The present disclosure relates to a solid-slate imaging element, a pupil correction method for a solid-state imaging element, an imaging device, and an information processing device.

BACKGROUND ART

These days, a technology in which a structural color filter in which a metal structure is fashioned by periodic microfabrication, such as what is called a plasmonic filter, is used as a wavelength selection element of a two-dimensional solid-state imaging element is proposed (for example, see Patent Literature 1 and Non-Patent Literature 1 below).

On the other hand, a camera module mounted on a personal digital assistant, a portable computer for personal use, or the like employs, from the requirements of downsizing and thinning, what is called pupil correction technology is which the chief ray angle (CRA) becomes larger from the center toward a peripheral portion of a two-dimensional captured image (for example, see Patent Literature 2 below). The downsizing and thinning of a camera module can be achieved by employing the pupil collection technology.

CITATION LIST

Patent Literature

Patent Literature 1: JP 2008-177191A
Patent literature 2: JP H6-140609A

Non-Patent Literature

Non-Patent Literature 1: S. Yokogawa, S. P. Burgos, and H. A. Atwater, "Plasmonic color filters for CMOS image sensor applications," Nano Letters, 12.8 (2012), p. 4349-4354.

Non-Patent Literature 2: S. P. Burgos, S. Yokogawa, and H. A. Atwater, "Color imaging via nearest neighbor hole coupling in plasmonic color filters integrated onto a complementary metal oxide semiconductor image sensor," Acs Nano, 7.11 (2013), p. 10038-10047.

DISCLOSURE OF INVENTION

Technical Problem

In a case where light is incident obliquely to a structural color filter like those disclosed in Patent Literature 1 and Non-Patent Literature 2 above, characteristic variations occur such as the shift of the peak position of the transmission wavelength of light to the long-wavelength side and the reduction in transmission efficiency in accordance with the light incident angle (for example, see Non-Patent Literature 2 above). However, at present, no measure is taken against such characteristic variations in structural color filters.

As a result, in a case where a structural color filter like the above is used as a wavelength selection element, there is no choice but to employ an optical system in which light is incident almost perpendicularly to the structural color filter, and the current situation is that it is difficult to design a camera module compactly.

Further, in a structural color filter such as the plasmonic filters disclosed in Patent Literature 1 and Non-Patent Literature 2 above, a plurality of opening portions is provided in a metal structure by periodic micro fabrication, and the transmission efficiency is decided by the interference of surface plasmon polaritons in neighboring opening portions. Hence, in a case where a structural color filter is mounted by using, as it is, a conventional light collecting system of a two-dimensional solid-state imaging element in which each pixel includes what is called an on-chip-type light collecting element, incident light forms a spot on the surface of the structural color filter. As a result, it is expected that the resonance effect will be weakened in an outer peripheral portion of the periodic structure of the structural color filter and the transmission efficiency as the integrated value in the entire surface of the filter will be reduced.

Thus, in view of the circumstances mentioned above, the present disclosure proposes a solid-slate imaging element and a pupil correction method for a solid-state imaging element that, in spite of using structural color filters, can suppress the reduction in transmission efficiency due to the change of the chief ray angle, and an imaging device and an information processing device using the solid-state imaging element.

Solution to Problem

According to the present disclosure, there is provided a solid-state imaging element including: a light receiving element included in a plurality of pixels; structural color filters located above at least part of the light receiving element and each including a metal film provided with a periodic opening pattern with a structural period smaller than a prescribed wavelength; and an interconnection layer located below the light receiving element and configured to acquire a signal of light detected by the light receiving element. The structural period is different between the structural color filters in accordance with a chief ray angle of incident light, and the structural period of the periodic opening pattern becomes smaller as the chief ray angle becomes larger, relative to the structural period of the periodic opening pattern at the chief ray angle of 0°.

In addition, according to the present disclosure, there is provided a pupil correction method for a solid-state imaging element, the pupil correction method including: arranging structural color filters each including a metal film provided with a periodic opening pattern with a structural period smaller than a prescribed wavelength, above at least part of a light receiving element of a solid-state imaging element, the solid-state imaging element including the light receiving element included in a plurality of pixels, and an interconnection layer located below the light receiving element and configured to acquire a signal of light detected by the light receiving element. The structural period is different between the structural color filters in accordance with a chief ray angle of incident light, and the structural period of the periodic opening pattern becomes smaller as the chief ray angle becomes larger, relative to the structural period of the periodic opening pattern at the chief ray angle of 0°.

Further, according to the present disclosure, an imaging device including at least a solid-state imaging element like the above and an optical system that guides light to the solid-state imaging element is provided.

Further, according to the present disclosure, an information processing device including an imaging device including at least a solid-state imaging element like the above and an optical system that guides light to the solid-state imaging element is provided.

According to the present disclosure, in structural color filters included in a solid-state imaging element, the structural period is different in accordance with the chief ray angle of incident light, specifically the structural period of the periodic opening pattern becomes smaller as the chief ray angle becomes larger, relative to the structural period of the periodic opening pattern at a chief ray angle of 0°; thus, the uniformity of the optical characteristics of the structural color filters is enhanced.

Advantageous Effects of Invention

As described above, according to the present disclosure, a solid-state imaging element and a pupil correction method for a solid-state imaging element that, in spite of using structural color filters, can suppress the reduction in transmission efficiency due to the change of the chief ray angle, and an imaging device and an information processing device using the solid-state imaging element can be provided.

Note that the effects described above are not necessarily limitative. With or in the place of the above effects these may be achieved any one of the effects described in this specification or other effects that may be grasped from this specification.

BRIEF DESCRIPTION, OF DRAWINGS

FIG. 27B is an explanatory diagram schematically showing an example of an arrangement state of structural color filters in a pixel array section of a solid-state imaging element according to the embodiment.

FIG. 27C is an explanatory diagram schematically showing an example of an arrangement state of color filters in a pixel array section of a solid-state imaging element according to the embodiment.

FIG. 28 is an explanatory diagram schematically showing an example of a configuration of an imaging device including a solid-state imaging element according to the embodiment.

MODE(S) FOR CARRYING OUT THE INVENTION

Figure 1:
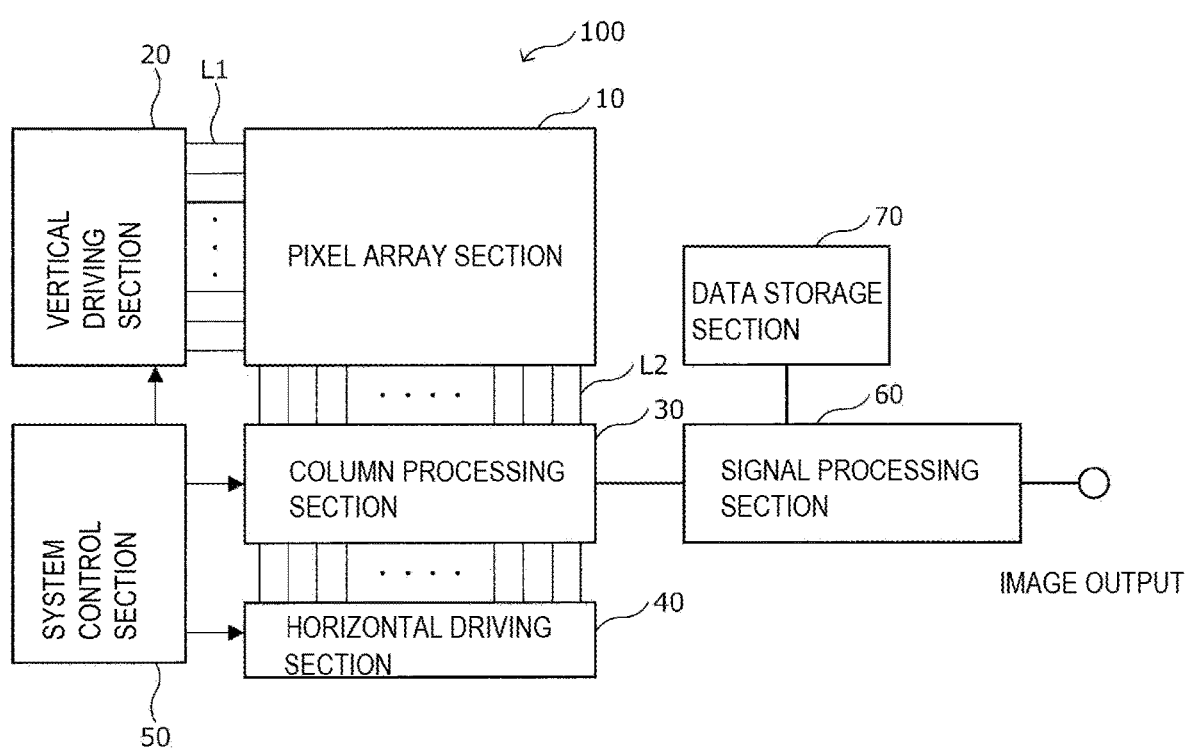
FIG. 1 is an explanatory diagram schematically showing an overall structure of a solid-state imaging element according to an embodiment of the present disclosure.

Hereinafter, (a) preferred embodiment(s) of the present disclosure will be described in detail with reference to the appended drawings. Note that, in this specification and the appended drawings, structural elements that have substantially the same function and structure are denoted with the same reference numerals, and repeated explanation of these structural elements is omitted.

Note that, the description is given in the following order.
1. First embodiment
1.1. With regard to overall configuration of solid-state imaging element
1.2. With regard to equivalent circuit diagram of unit pixel
1.3. With regard to structure of structural color filters and pupil correction method
1.4. With regard to structure of pixel array section
1.5. With regard to configurations of imaging devices
1.6. With regard to method for manufacturing solid-state imaging element
2. Conclusions

First Embodiment

<With Regard to Overall Configuration of Solid-State Imaging Element>

First, the overall configuration of a solid-state imaging element according to a first embodiment of the present disclosure is briefly described with reference to FIG. 1. FIG. 1 is an explanatory diagram schematically showing the overall configuration of a solid-state imaging element according to the present embodiment. Note that, in the following, a description is given taking a four-transistor back-side illumination image sensor as an example of the solid-state imaging element.

A solid-state imaging element 10 according to the present embodiment includes, as schematically shown in FIG. 1, a pixel array section 10, a vertical driving section 20, a column processing section 30, a horizontal driving section 40, and a system control section 50. Note that the pixel array section 10, the vertical driving section 20, the column processing section 30, the horizontal driving section 40, and the system control section 50 are formed on one not-illustrated semiconductor substrate (chip), for example.

Further, the solid-state imaging element 100 preferably further includes a signal processing section 60 and a data storage section 70. Note that the signal processing section 60 and the data storage section 70 may include, for example, an external signal processing section that is provided on a substrate different from the substrate of the solid-state imaging element 100 and that performs processing with a digital signal processor (DSP) and a software application. Further, the signal processing section 60 and the data storage section 70 may be mourned on, for example, the same semiconductor substrate as the semiconductor substrate on which the pixel array section 10 etc. are formed.

The pixel array section 10 includes a plurality of unit pixels that are two-dimensionally arranged in a matrix configuration (hereinafter, occasionally referred to as simply "pixels"). Further, a photoelectric conversion element (in the present embodiment, a photodiode) that generates an amount of charge corresponding to the amount of incident light (hereinafter, referred to as simply "charge") and accumulates the charge in the inside is provided in each pixel.

The pixel array section 10 further includes a pixel driving line L1 formed along the row direction (the left and right direction in FIG. 1) for each row of pixels that are two-dimensionally arranged in a matrix configuration and a vertical signal line L2 formed along the column direction (the up and down direction in FIG. 1) for each column. Note that each pixel driving line L1 is connected to the pixels of the corresponding row, and each vertical signal line L2 is connected to the pixels of the corresponding column.

Further, one end of a pixel driving line L1 is connected to an output end of the vertical driving section 20, which end is of the row corresponding to that pixel driving line L1, and one end of a vertical signal line L2 is connected to an input end of the column processing section 30, which end is of the column corresponding to that vertical signal line L2. Note that, although in FIG. 1 the pixel driving line L1 of each row is shown as one signal line for simpler description, usually a plurality of signal lines that each drive a plurality of transistors included in the pixel is provided for each row, as described later.

The vertical driving section 20 includes, for example, circuit elements such as a shift register and an address decoder. The vertical driving section 20 outputs various driving signals to each pixel of the pixel array section 10 to drive each pixel, and reads out a signal from each pixel.

For each column of pixels of the pixel array section 10, the column processing section 30 performs prescribed signal processing on a pixel signal that is outputted from a prescribed pixel of a selected row via the vertical signal line L2, and temporarily holds the pixel signal after signal processing.

Specifically, the column processing section 30 performs, as signal processing, at least denoising processing such as correlated double sampling (CDS) processing, for example. By CDS processing in the column processing section 30, for example, reset noise and pixel-unique fixed pattern noise caused by a threshold variation of an amplification transistor etc. can be removed. Note that it is also possible to employ a configuration in which the column processing section 30 is provided with, for example, an analog-to-digital (A/D) conversion function as well as the denoising function described above and a digital signal is outputted.

The horizontal driving section 40 includes, for example, circuit elements such as a shift register and an address decoder. The horizontal driving section 40 sequentially and selectively scans unit circuits (not illustrated) each provided for each column of the column processing section 30. By the selective scanning of the horizontal driving section 40, pixel signals that are signal-processed in the unit circuits of the column processing section 30 are sequentially outputted to the signal processing section 60.

The system control section 50 includes, for example, a timing generator that generates timing signals of various operations of the solid-state imaging element 100, or the like. Then, various timing signals generated in the system control section 50 are supplied to the vertical driving section 20, the column processing section 30, and the horizontal driving section 40, and the driving of each part is controlled on the basis of the timing signals.

The signal processing section 60 performs, for example, various pieces of signal processing such as addition processing on a pixel signal outputted from the column processing section 30. Further, the data storage section 70 temporarily stores data that are necessary when performing prescribed signal processing in the signal processing section 60.

Hereinabove, the overall configuration of the solid-state imaging element 100 according to the present embodiment is briefly described with reference to FIG. 1.

<With Regard to Equivalent Circuit Diagram of Unit Pixel>

Next, an equivalent circuit diagram of a unit pixel in a four-transistor image sensor like that shown in FIG. 1 is briefly described with reference to FIG. 2.

A pixel usually includes one photodiode 1001 (photoelectric conversion element), various active elements including MOS transistors provided for the one photodiode 1001, and a floating diffusion (FD) region 1011. In the example shown in FIG. 2, the pixel includes, as various active elements, a transfer transistor 1003, an amplification transistor 1005, a reset transistor 1007, and a selection transistor 1009. Note that FIG. 2 shows an example in which each of the various transistors is formed using a MOS transistor of an n-type carrier polarity.

Figure 2:
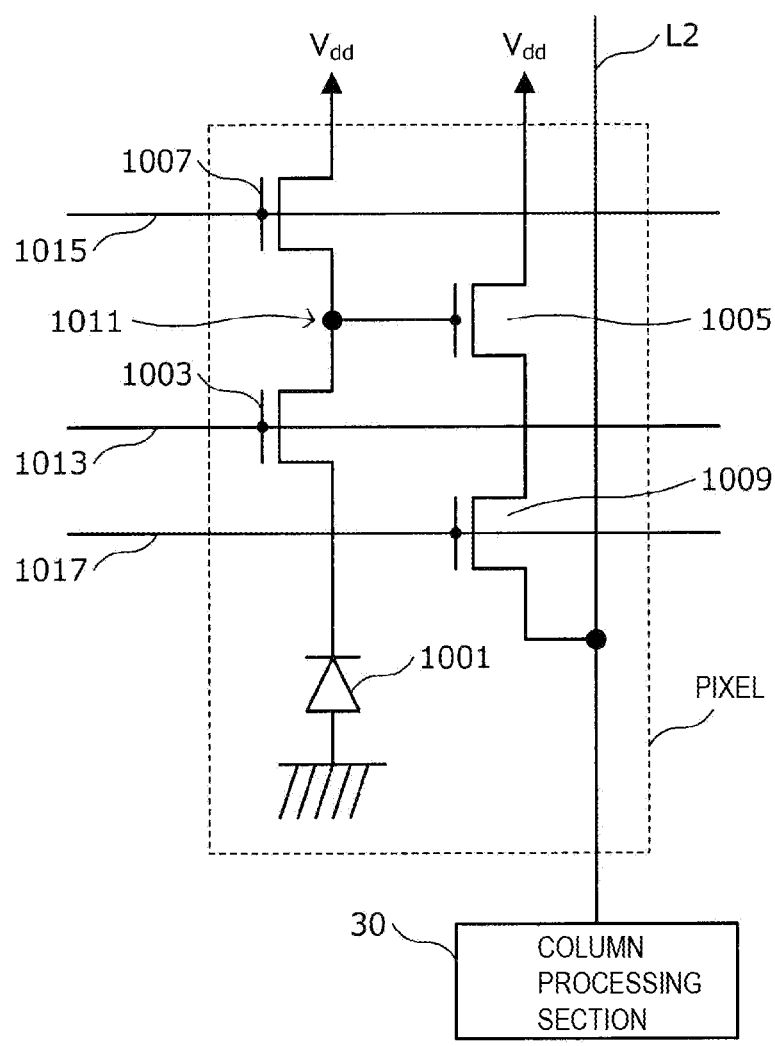
FIG. 2 is an equivalent circuit diagram of a unit pixel in a solid-state imaging element according to the embodiment.

Further, in the example shown in FIG. 2, for one pixel three signal interconnections of a transfer interconnection 1013, a reset interconnection 1015, and a selection interconnection 1017 (the pixel driving lines L1) are provided in the row direction (the left and right direction in FIG. 2), and the vertical signal line L2 is provided in the column direction (the up and down direction in FIG. 2). Note that, although not illustrated in FIG. 2, also a two-dimensional interconnection used as a light blocking film is provided in a pixel boundary portion and a black level detection pixel among the pixels.

The photodiode 1001 converts incident light to an amount of charge corresponding to the amount of incident light (herein, electrons) (that is, incident light is photoelectrical converted to a charge). Note that the anode of the photodiode 1001 is grounded as shown in FIG. 2.

The transfer transistor 1003 is provided between the cathode of the photodiode 1001 and the FD region 1011. When a high-level signal is inputted to the gate of the transfer transistor 1003 from the vertical driving section L1 via the transfer interconnection 1013, the transfer transistor 1003 enters the ON state, and transfers a charge (electrons) generated by photoelectric conversion in the photodiode 1001 to the FD region 1011. Note that the charge transferred to the FD region 1011 is convened to a voltage (electric potential) in the FD region 1011.

The gate of the amplification transistor 1005 is connected to the FD region 1011. Further, the drain of the amplification transistor 1005 is connected to a terminal for supplying a power supply voltage $V_{dd}$, and the source of the amplification transistor 1005 is connected to the vertical signal line L2 via the selection transistor 1009. The amplification transistor 1005 amplifies the electric potential (the voltage signal) of the FD region 1011, and outputs the amplified signal as a light accumulation signal (a pixel signal) to the selection transistor 1009.

The reset transistor 1007 is provided between a terminal for supplying the power supply voltage $V_{dd}$ and the FD region 1011. When a high-level signal is inputted to the gate of the reset transistor 1007 from the vertical driving section 20 via the reset interconnection 1015, the reset transistor 1007 enters the ON state, and resets the electric potential of the FD region 1011 to the power supply voltage $V_{dd}$.

The selection transistor 1009 is provided between the amplification transistor 1005 and the vertical signal line L2. When a high-level signal is inputted to the gate of the selection transistor 1009 from the vertical driving section 20 via the selection interconnection 1017, the selection transistor 1009 enters the ON state, and outputs a voltage signal amplified in the amplification transistor 1005 to the vertical signal line L2. That is, in a case where the solid-state imaging element 100 is a four-transistor image sensor, the switching between selection and non-selection of a pixel is compiled by the selection transistor 1009. Note that the voltage signal of each pixel outputted to the vertical signal line L2 is transferred to the column processing section 30.

Hereinabove, an equivalent circuit diagram of a unit pixel in a four-transistor image sensor is briefly described with reference to FIG. 2.

With Regard to Structure of Structural Color Filters and Pupil Correction Method>

In the following, with reference to FIG. 3 to FIG. 11B changes in optical characteristics in structural color filters are described, and the structure of structural color filters in a solid-state imaging element and a pupil correction method according to the present embodiment are described in detail.

Figure 3:
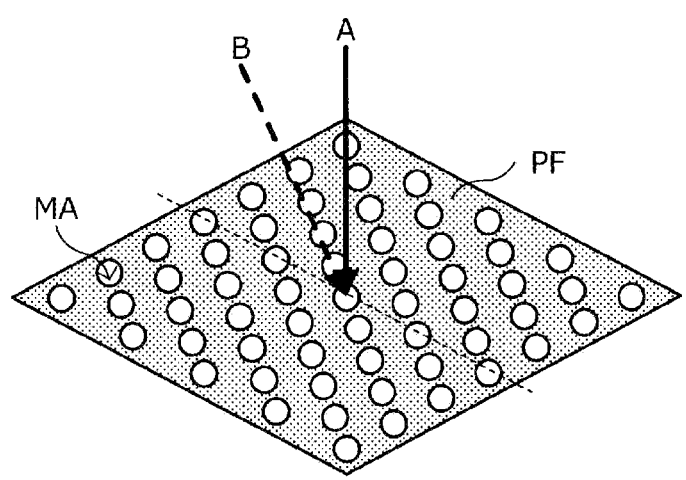
FIG. 3 is an explanatory diagram for describing changes in optical characteristics in a common structural color filter.
Figure 4A:
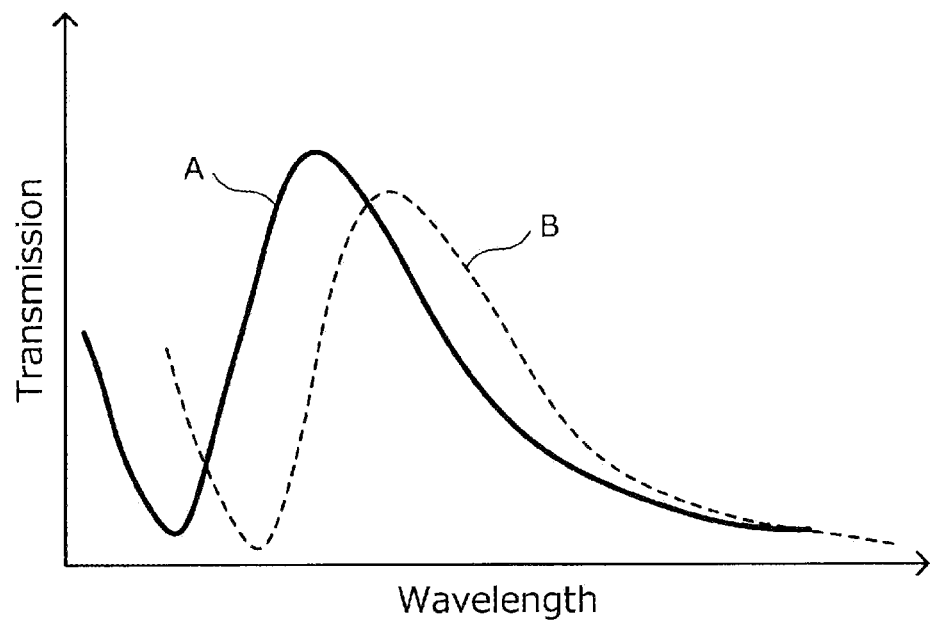
FIG. 4A is an explanatory diagram for describing changes in optical characteristics in a common structural color filter.
Figure 4B:
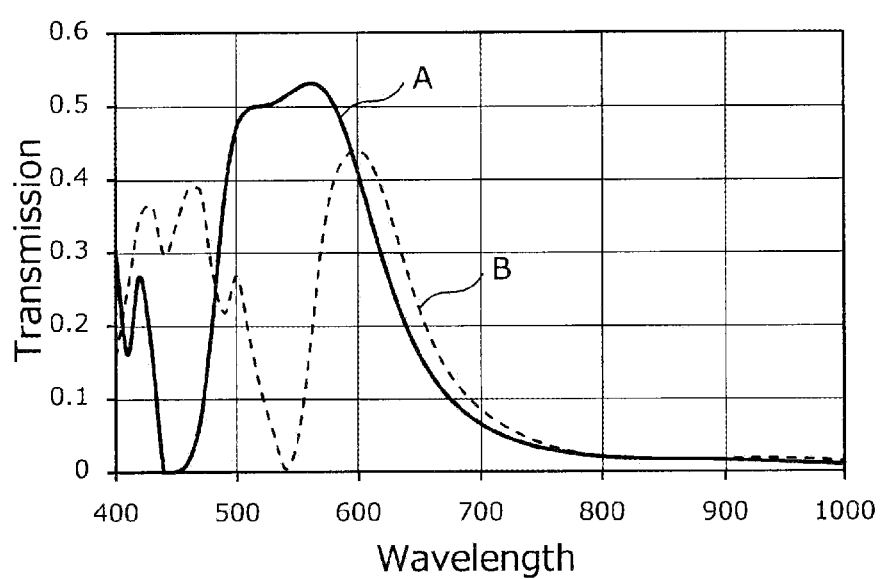
FIG. 4B is an explanatory diagram for describing changes in optical characteristics in a common structural color filter.
Figure 4C:
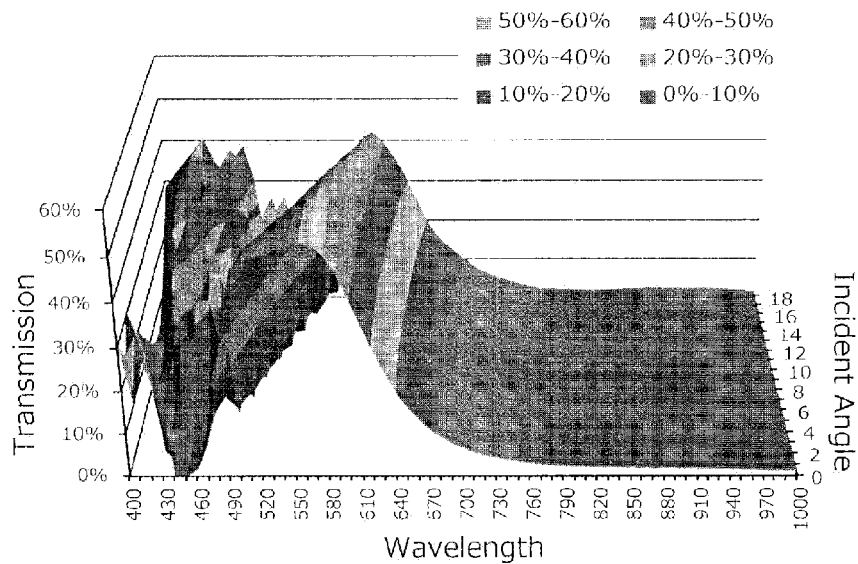
FIG. 4C is an explanatory diagram for describing changes in optical characteristics in a common structural color filter.
Figure 5:
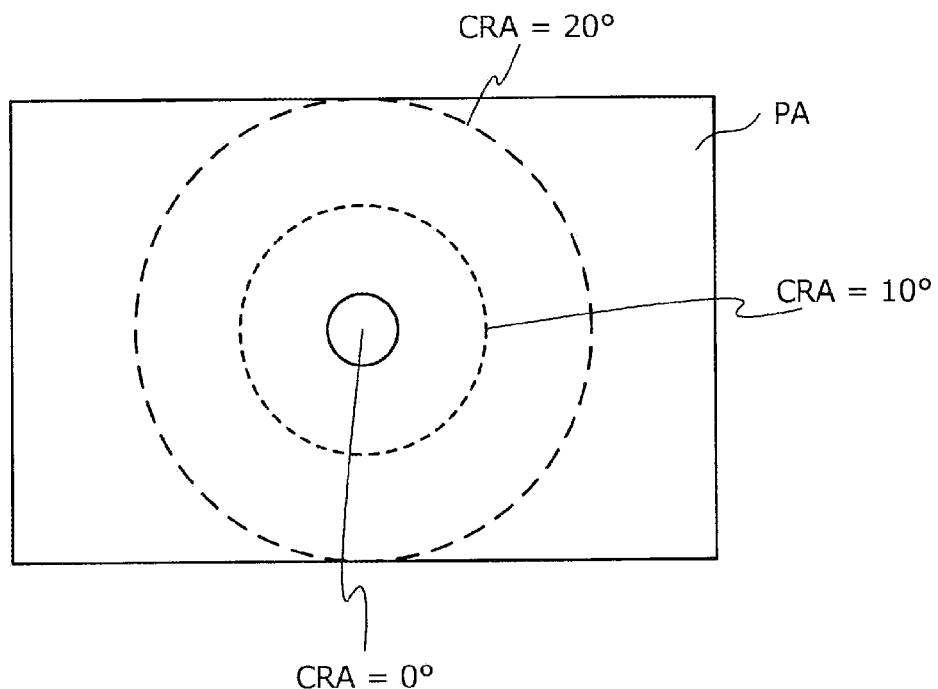
FIG. 5 is an explanatory diagram for describing changes in optical characteristics in a common thin lens module.
Figure 6:
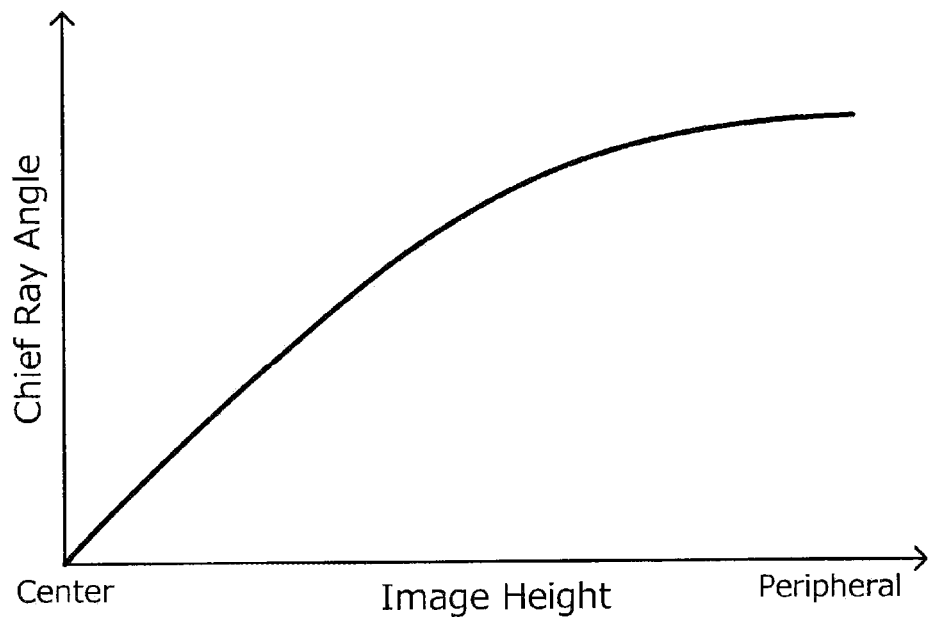
FIG. 6 is an explanatory diagram for describing changes in optical characteristics in a common thin lens module.
Figure 7:
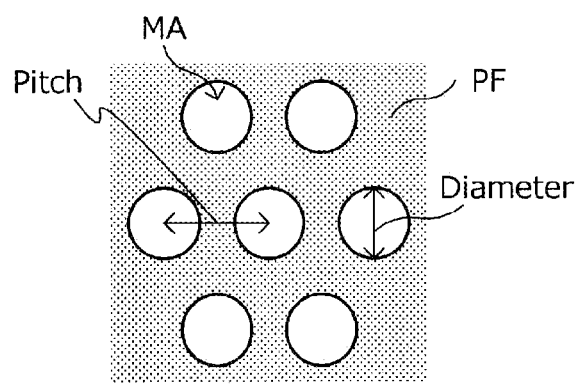
FIG. 7 is an explanatory diagram for describing changes in optical characteristics in a common structural color filter.
Figure 8A:
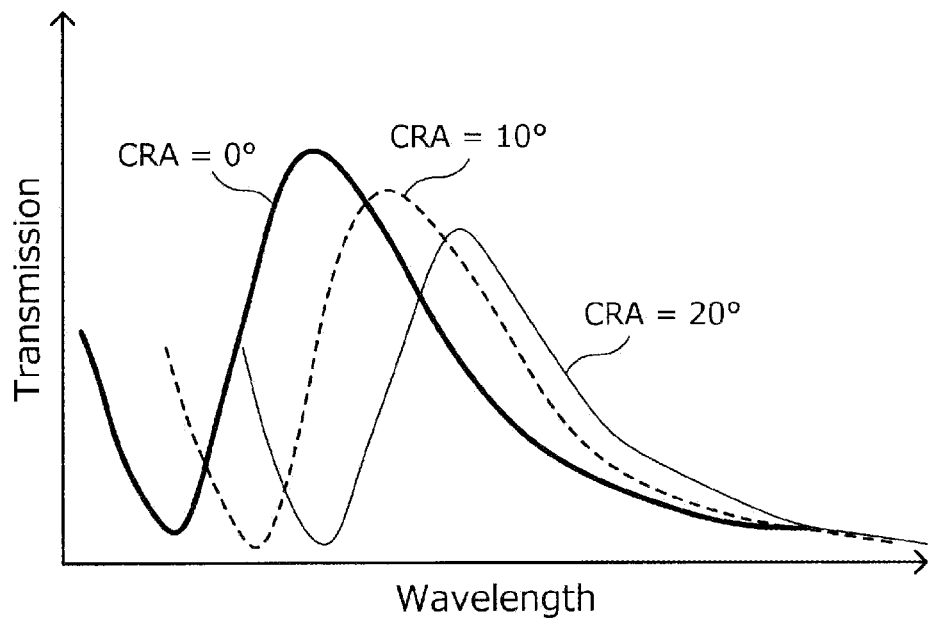
FIG. 8A is an explanatory diagram for describing changes in optical characteristics in a common structural color filter.
Figure 8B:
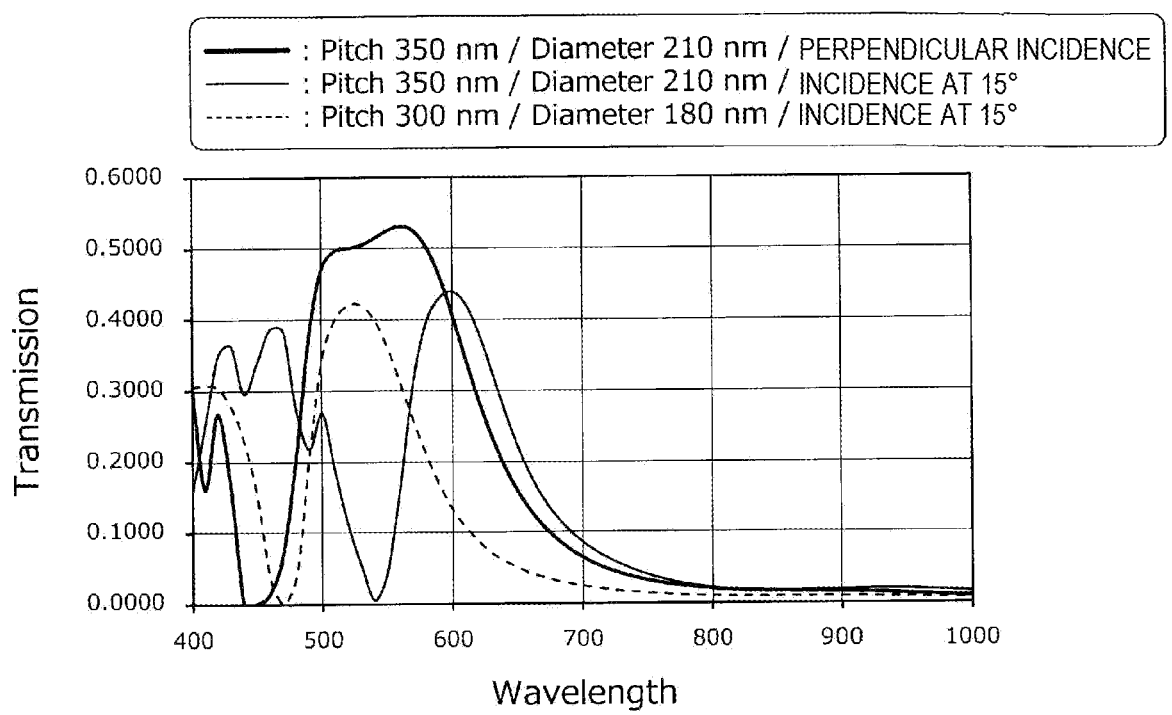
FIG. 8B is an explanatory diagram for describing changes in optical characteristics in a common structural color filter.
Figure 9A:
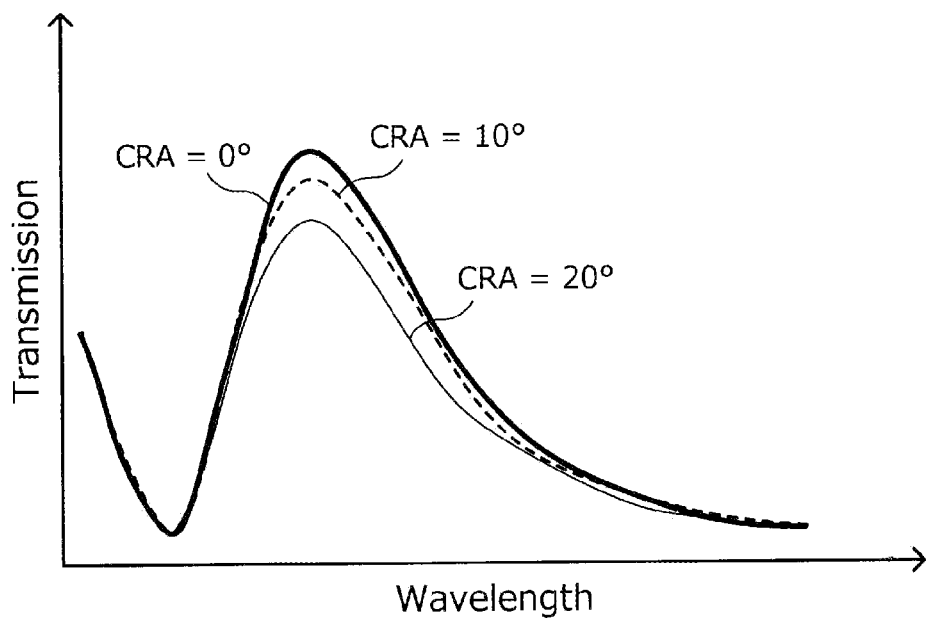
FIG. 9A is an explanatory diagram for describing a pupil correction method in a solid-state imaging element according to the embodiment.
Figure 9B:
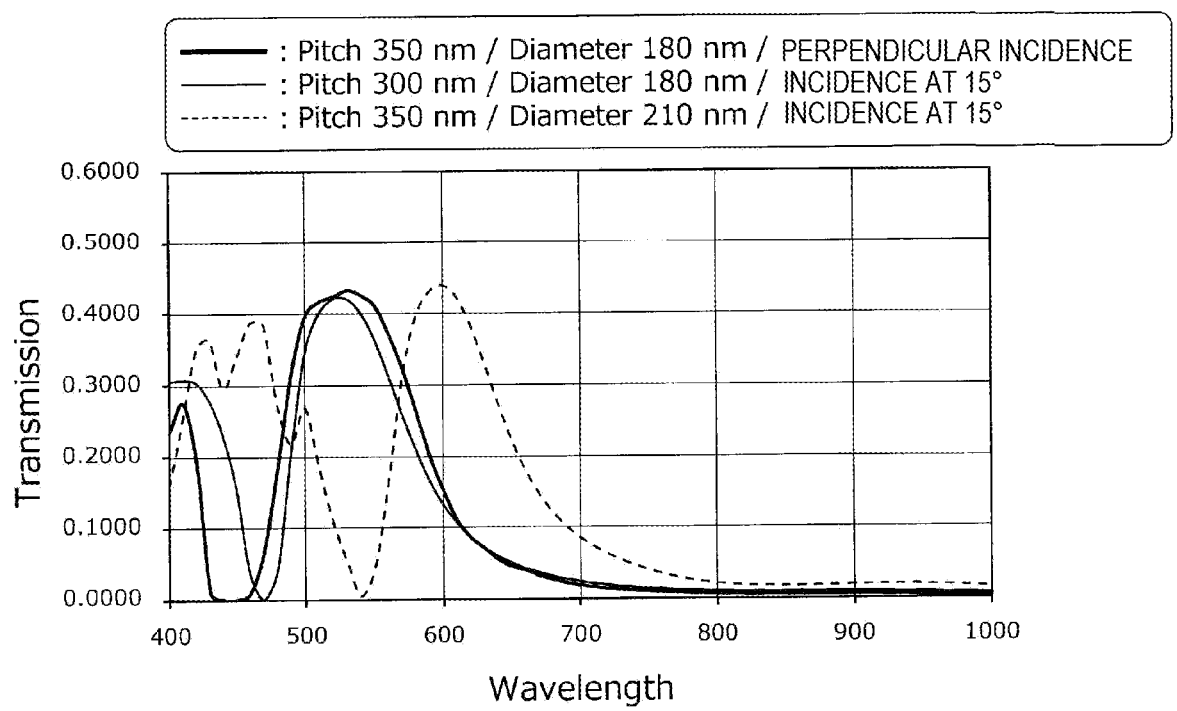
FIG. 9B is an explanatory diagram for describing a pupil correction method in a solid-state imaging element according to the embodiment.
Figure 10:
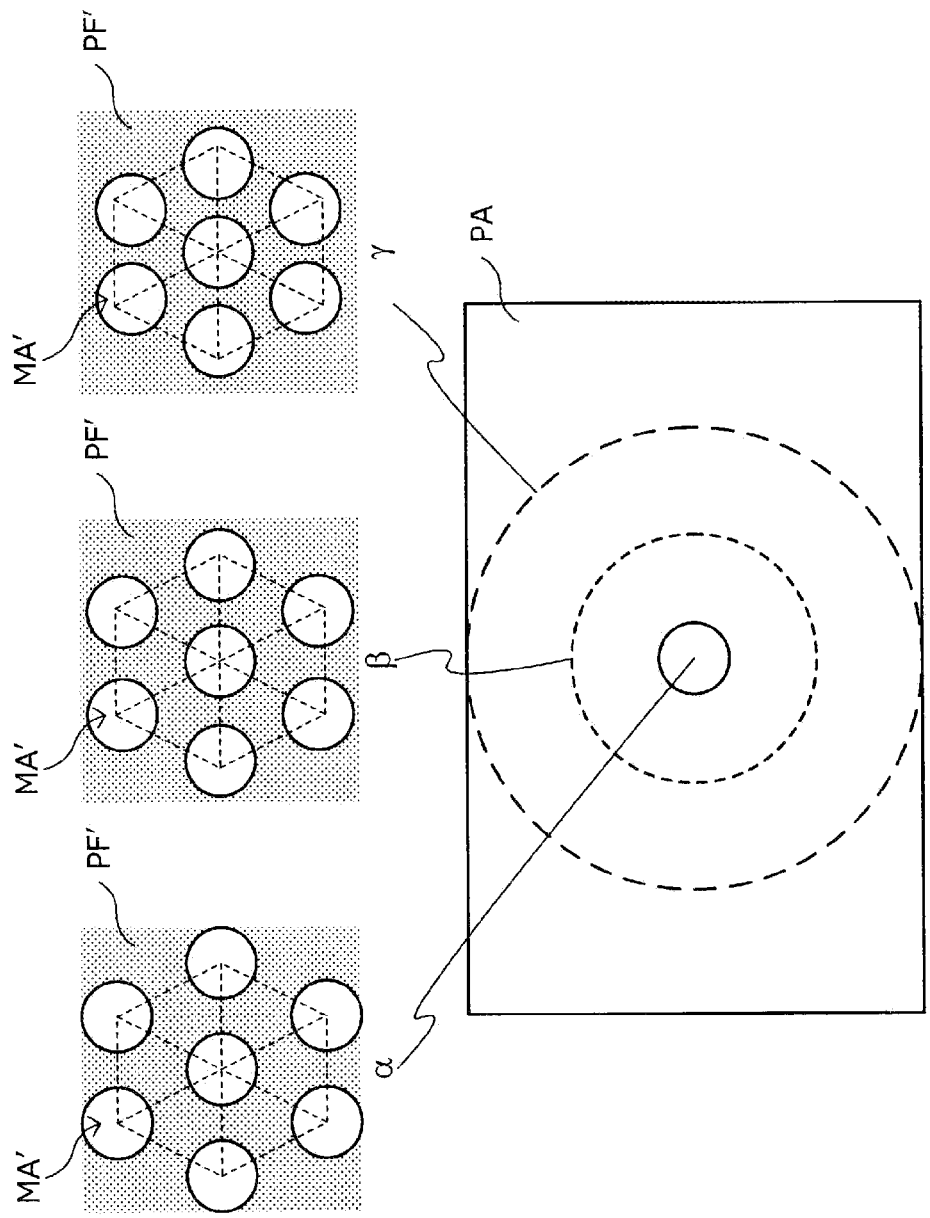
FIG. 10 is an explanatory diagram for describing a pupil correction method in a solid-state imaging element according to the embodiment.
Figure 11A:
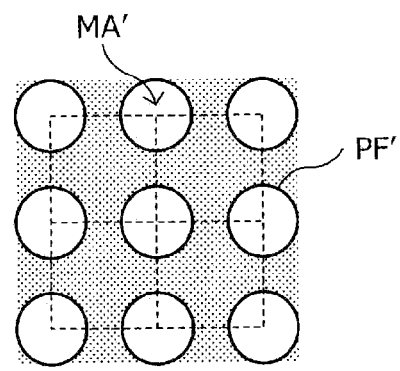
FIG. 11A is an explanatory diagram for describing a structural color filter in a pixel array section of a solid-state imaging element according to the embodiment.
Figure 11B:
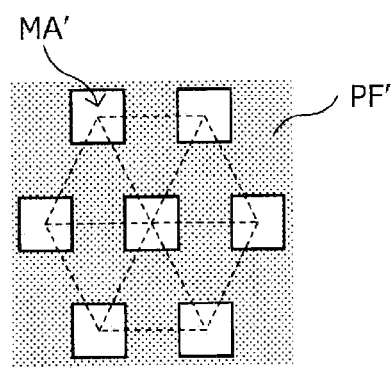
FIG. 11B is an explanatory diagram for describing a structural color filter in a pixel array section of a solid-state imaging element according to the embodiment.

FIG. 3, FIG. 4A to FIG. 4C, FIG. 7, and FIG. 8A and FIG. 8B are explanatory diagrams for describing changes in optical characteristics in a common structural color filer. FIG. 5 and FIG. 6 are explanatory diagrams for describing changes in optical characteristics in common thin module lenses. FIG. 9A and FIG. 9B are explanatory diagrams for describing a pupil correction method in a solid-state imaging element according to the present embodiment, and FIG. 10 is an explanatory diagram for describing a pupil correction method in a solid-state imaging element according to the present embodiment. FIG. 11A and FIG. 11B are explanatory diagrams for describing structural color filters in a pixel array section of a solid-state imaging element according to the present embodiment.

[Studies on Common Structural Color Filter]

FIG. 3 is an explanatory diagram schematically showing the structure of a structural color filter.

A plasmonic fiber, which is a typical kind of structural color filter, is a structural filter including a metal and a dielectric provided on a surface of the metal, and is a structural filter utilizing surface plasmon polaritons generated at the interface between the metal and the dielectric. The structural color filter utilizes the interference and resonance of generated surface plasmon polaritons, and selectively transmits, reflects, or absorbs components having a specific wavelength from the incident light (photons).

A structural color filter PF has a periodic fine structural pattern of a subwavelength scale. In the structural color filter PF shown in FIG. 3, a plurality of minute openings (holes) MA each having a diameter (that is, a diameter of a subwavelength scale) that is smaller than the wavelength of light detected by a solid-state imaging element provided with the structural color filter PF are provided in a metal thin film provided with a dielectric (not illustrated). Further, the minute openings MA are arranged in a two-dimensional arrangement form in the metal thin film.

The structural color filter PF has distinctive transmissivity derived from its structure and the physical properties of the metal and the dielectric existing on a surface of the metal. That is, a fine periodic structure exists on the metal surface in the structural color filter PF; thereby, surface plasmon polaritons generated at the boundary between the surface of the metal thin film and the surrounding dielectric interfere together, and a transmission wavelength profile peculiar to the structure and the physical property values is obtained. Further, the dispersion relation of surface plasmon polaritons depends on the complex refractive index between the metal and the dielectric in a close vicinity of the metal surface (an area of several hundred nanometers from the surface), and therefore has high sensitivity to the refractive index change in the small region.

The structural color filter PF has a transmission wavelength profile peculiar to a structure and physical property values like the above; thus, the filter response in a case where light is incident perpendicularly (in a case of the light incidence shown by A in FIG. 3) and the filter response in a case where light is incident obliquely (in a case of the light incidence shown by B in FIG. 3) are generally different.

For example, case A where light is incident perpendicularly (at a normal incident angle) to the structural color filter and case B where light is incident obliquely (at a non-normal incident angle) to the structural color filter (for example, a case where light is incident at an incident angle of 15 degrees) are taken up. FIG. 4A schematically shows how the transmittance of a structural color filter changes if the wavelength of incident light is changed in these cases. As is clear from FIG. 4A, by light being incident obliquely, the wavelength of light transmitted through the structural color filter experiences a long-wavelength shift, and further also the transmittance changes. FIG. 4B shows the result of a concrete verification of a change in the transmittance of a structural color filter having a common structure between both of case A where light is incident perpendicularly to the structural color filter and case B where light is incident obliquely to the structural color filter at an incident angle of 15 degrees. As is clear also from FIG. 4B, it can be seen that, by light being incident obliquely, the wavelength of light transmitted through the structural color filter has experienced a long-wavelength shift, and further also the transmittance has changed. Similarly, the transmittance of a structural color filter was simulated using a commercially available application while the light incident angle was changed in the range of 0 degrees to 18 degrees; as shown in FIG. 4C, it has been found that the transmission peak wavelength shifts from around 550 nm to approximately 600 nm as the incident angle becomes larger.

Next, a relationship between the chief ray angle (CRA) and the image height of thin module lenses employed in a common smartphone, personal digital assistant, or the like is described with reference to FIG. 5 and FIG. 6.

As schematically shown in FIG. 5 and FIG. 6, for the common thin module lenses, the image height is low and the chief ray angle CRA is 0 degrees in a central portion of an effective pixel area PA of a solid-state imaging element. Further, for the common thin module lenses, the image height becomes higher and the chief ray angle CRA becomes a larger value toward a peripheral portion of the effective pixel area PA. Processing for keeping the pixel characteristics and the color invariant against such a phenomenon is pupil correction processing; a common thin solid-state imaging element has generally employed a method in which a light collecting element and a color filter are shifted horizontally in a horizontal plane with respect to the pixel.

Next, changes in optical characteristics occurring in a case where a lens module having chief ray angle characteristics like those shown in FIG. 6 is employed for common structural color filters (plasmonic filters) are described with reference to FIG. 7 to FIG. 8B.

In a common structural color filter PF typified by a plasmonic filter, minute openings MA are periodically formed as schematically shown in FIG. 3. Here, in the common structural color filter PF, the size of the opening MA (for example, the diameter of the opening MA (Diameter) in FIG. 7) and the distance between mutually adjacent openings MA (for example, the distance between the centers of mutually adjacent openings shown by Pitch in FIG. 7) are fixed in all the regions of the aperture surface of the structural color filter PF. On the other hand, in the effective pixel area PA of a solid-state imaging element, the chief ray angle CRA becomes larger from the center toward a higher image height, as mentioned above. Hence, in the common structural color filter PF typified by a plasmonic filter, as schematically shown in FIG. 8A, the transmission peak wavelength shifts to longer wavelengths and the transmittance becomes lower as the chief ray angle CRA becomes larger, as compared to a case where light is incident perpendicularly. FIG. 8B collectively shows the behavior of the filter transmittance in a case where light is incident perpendicularly or is incident at an incident angle of 15 degrees in a case where Pitch in FIG. 7 is set to 350 nm and Diameter is set to 210 nm, and the behavior of the filter transmittance in a case where light is incident at an incident angle of 15 degrees in a case where Pitch in FIG. 7 is set to 300 nm and Diameter is set to 180 nm. As is clear by comparing the results in the cases of having the same Pitch and Diameter in FIG. 8B, it can be seen that, by light being incident from an oblique direction, the transmission peak wavelength experiences a long-wavelength shift and furthermore the transmittance decreases. On the other hand, as is clear by comparing the two examples in which the incident angle is the same but Pitch and Diameter are different, it can be seen that, in the example in which Pitch and Diameter are set to smaller values, the transmission peak wavelength exists on the shorter wavelength side even for oblique incidence. As is clear also from this result, in a case where the common structural color filter PF is used, a change occurs in optical characteristics between a central portion and a peripheral portion of the effective pixel area PA.

[Structure of Structural Color Filters and Pupil Correction Method According to Present Embodiment]

As described hereinabove, to use structural color filters for a solid-state imaging element, it is important to suppress a long-wavelength shift of the transmission peak wavelength occurring in a case where the chief ray angle CRA is changed, that is, to prevent the occurrence of a shift of the transmission peak wavelength even if the thief ray angle CRA is changed (even if the chief ray angle CRA becomes larger than that in a central portion), as schematically shown in FIG. 9A. Further, when using structural color filters for a solid-state imaging element, it is more preferable to suppress the reduction in transmittance occurring in a case where the chief ray angle CRA is changed. To this end, pupil correction processing like that described in detail below is performed in a solid-state imaging element according to the present embodiment. Thereby, the change of the distribution in the effective pixel area of wavelength directions (color shading) and the change of the intensity distribution (luminance shading) can be minimized in the solid-state imaging element according to the present embodiment described in detail below.

Specifically, in structural color filters according to the present embodiment, the spacing (Pitch) between openings like that schematically shown in FIG. 7 is set such that the spacing (Pitch) between openings in a peripheral portion of the effective pixel area is smaller than the spacing between openings in a central portion of the effective pixel area. Thus, in the structural color filters according to the present embodiment, the magnitude of the shift of the transmission peak wavelength associated with the change of the chief ray angle CRA is corrected so that transmission peak wavelengths are almost uniform. Further, in a case where the change in transmittance associated with the change of the chief ray angle CRA is significant, the change in transmittance associated with the change of the chief ray angle CRA can be made uniform in the structural color filters according to the present embodiment by adjusting the size (Diameter) of an opening like that schematically shown in FIG. 7. That is, the change in transmittance associated with the change of the chief ray angle CRA can be made uniform by setting the size of the opening smaller in a more peripheral portion of the effective pixel area in accordance with the image height on the image surface of the solid-state imaging element.

FIG. 9B collectively shows the behavior of the filter transmittance in a case where light is incident perpendicularly or is incident at an incident angle of 15 degrees in a case where Pitch in FIG. 7 is set to 350 nm and Diameter is set to 180 nm, and the behavior of the filter transmittance in a case where light is incident at an incident angle of 15 degrees in a case where Pitch in FIG. 7 is set to 350 nm and Diameter is set to 210 nm. In FIG. 9B, as is clear by comparing the results in the cases where Pitch is different but Diameter is the same, it can be seen that, by setting Pitch smaller in a more peripheral portion of the effective pixel area, the shift of the transmission peak wavelength and the reduction in transmittance can be suppressed even in a case where light is incident from an oblique direction. On the other hand, as is clear by comparing the examples in which Pitch is the same, it can be seen that the shift of the transmission peak wavelength cannot be suppressed in the case where Pitch is set the same between a central portion and a peripheral portion of the effective pixel area.

In the following, the structure of structural color filters according to the present embodiment and the pupil correction method performed by using the structural color filters are described in more detail with reference to FIG. 10 to FIG. 11B.

The lower side of FIG. 10 schematically shows an effective pixel area PA of a two-dimensional solid-state imaging element. In the effective pixel area PA, pixels are arranged in a two-dimensional arrangement form of X pixels horizontally and Y pixels vertically (for example, in a case of a solid-state imaging element of Full HD, X=1920, and Y=1080). Further, structural color filters PF' each including a metal thin film having a plurality of minute openings MA' existing periodically are provided in a partial pixel region xy of numbers smaller than the values of X and Y (x horizontally and y vertically; for example, x=y=2).

Similarly to the common structural color filter PF, the structural color filter PF' is a structural filter including a metal and a dielectric provided on a surface of the metal, and is preferably a structural filter utilizing surface plasmon polaritons generated at the interface between the metal and the dielectric. The structural color filter PF' utilizes the interference and resonance of generated surface plasmon polaritons, and selectively transmits, reflects, or absorbs light having a specific wavelength from the incident light (photons).

Here, the metal used for the structural color filter PF' is preferably a metal containing aluminum (Al), copper (Cu), silver (Ag), gold (Au), titanium (Ti), or tungsten (W), or an alloy of these elements as a main component. Further, the dielectric used for the structural color filter PF' is preferably at least one of silicon oxide, silicon nitride, magnesium fluoride, hafnium oxide, aluminum oxide, titanium oxide, zirconium oxide, or tantalum oxide.

The structural color filter PF' has a periodic fine structural pattern of a subwavelength scale. In the structural color filter PF', a plurality of minute openings (holes) MA' each having a diameter (that is, a diameter of a subwavelength scale) that is smaller than the wavelength of light detected by a solid-state imaging element provided with the structural color filter PF' is provided in a metal thin film provided with a dielectric (not illustrated). Further, the minute openings MA' are arranged in a one-dimensional arrangement form or a two-dimensional arrangement form in the metal thin film.

Also the structural color filter PF' has distinctive transmissivity derived from its structure and the physical properties of the metal and the dielectric existing on a surface of the metal. That is, a fine periodic structure exists on the metal surface in the structural color filter PF'; thereby, surface plasmon polaritons generated at the boundary between the surface of the metal thin film and the surrounding dielectric interfere together, and a transmission wavelength profile peculiar to the structure and the physical property values is obtained. Further, the dispersion relation of surface plasmon polaritons depends on the complex refractive index between the metal and the dielectric in a close vicinity of the metal surface (an area of several hundred nanometers from the surface), and therefore has high sensitivity to the refractive index change in the small region.

In the structural color filter PF' according to the present embodiment, the minute opening MA' may have, for example as shown in FIG. 10, an opening shape of a substantially circular shape. Further, for example as shown in FIG. 10, the minute openings MA' may be preferably provided in the positions of the vertices of triangles (for example, regular triangles) that imaginarily fill the aperture surface of the structural color filter PF' in a planar way.

For structural color filters PF' according to the present embodiment, in a case where attention is given to filters A corresponding to a specific color in a filter group including a plurality of kinds of structural color filters, the pitch between mutually adjacent minute openings MA' (the length of a line segment connecting the centers of adjacent openings MA) is different between structural color filter α located in a central region of the effective pixel area, structural color filter β located in a region slightly on the outside of the center, and structural color filter γ located in an outer peripheral region of the effective pixel area. Specifically, as schematically shown in FIG. 10, the pitch between adjacent openings is smaller at a more peripheral image height (>0 percent), as compared to the pitch between adjacent openings at an image height of 0 percent (that is, the central region). Note that, in FIG. 10, the pitch between adjacent openings shown by the broken line in the diagrams on the upper side shows the pitch between adjacent openings at an image height of 0 percent (that is, the central region).

Here, how to make the pitch between adjacent openings smaller for each image height is not particularly limited as long as the pitch between adjacent openings is set smaller at a more peripheral image height. For example, the pitch between adjacent openings in a peripheral portion may be set such that, as the image height becomes higher, the pitch between adjacent openings becomes smaller gradually at a certain rate from the pitch between adjacent openings in a central region. Further, the pitch between adjacent openings may not become smaller gradually at a certain rate, and the magnitude of the pitch between adjacent openings may change step by step.

More specifically, in the structural color filters PF' according to the present embodiment, the magnitude of the pitch between adjacent openings preferably changes within the range of 100 nm to 1000 nm. By the magnitude of the pitch between adjacent openings being within the range of 100 nm to 1000 nm, light in the visible light wavelength region to the infrared wavelength region can be transmitted almost uniformly while the shift of the transmission peak wavelength associated with the change of the chief ray angle is suppressed.

Further, for the structural color filters PF' according to the present embodiment, in a case where attention is given to filters A corresponding to a specific color in a filter group including a plurality of kinds of structural color filters, the size of the minute opening MA' may be fixed or varied between structural color filter α located in a central region of the effective pixel area, structural color filter β located in a region slightly on the outside of the center and structural color filter γ located in an outer peripheral region of the effective pixel area. In a case where the size of the minute opening MA' is varied between structural color filters in various positions, the size of the minute opening MA' may be set smaller at a more peripheral image height.

In this event, how to make the size of the minute opening MA' smaller for each image height is not particularly limited as long as the size of the minute opening MA' is set smaller at a more peripheral image height. For example, the size of the minute opening MA' in a peripheral portion may be set such that, as the image height becomes higher, the size becomes smaller gradually at a certain rate from the size of the minute opening MA' in a central region. Further, the size of the minute opening MA' may not become smaller gradually at a certain rate, and the size of the minute opening MA' may change step by step.

More specifically, in the structural color filters PF' according to the present embodiment, the size of the minute opening MA' (for example, the diameter of the minute opening MA' in FIG. 10) preferably has a value within the range of 50 nm to 500 nm. Further, in a case where the size of the minute opening MA' is changed between structural color filters PF' according to the present embodiment, the size of the minute opening MA' (for example, the diameter of the minute opening MA' in FIG. 10) preferably changes within the range of 50 nm to 500 nm. By setting the size of the minute opening MA' within the range of 50 nm to 500 nm, light in the visible light wavelength region to the infrared wavelength region can be transmitted almost uniformly while the reduction in transmittance associated with the change of the chief ray angle is suppressed.

Here, FIG. 10 shows a case where a plurality of minute openings MA' provided in the structural color filter PF' is provided in the positions of the vertices of substantially triangular shapes that imaginarily fill the aperture surface of the structural color filter PF' in a planar way. However, the method for arranging minute openings MA' is not limited to a triangular arrangement like that shown in FIG. 10, and may be a square arrangement like that shown in FIG. 11A. That is, as schematically shown in FIG. 11A, minute openings MA' may be provided in the positions of the vertices of squares or rectangles that imaginarily fill the aperture surface of the structural color filter PF' in a planar way.

Further, FIG. 10 shows a case where each of the plurality of minute openings MA' provided in the structural color filter PF' has an opening shape of a substantially circular shape. However, the opening shape of the minute opening MA' is not limited to an opening shape of a substantially circular shape like that shown in FIG. 10, and may be an opening shape of a substantially rectangular shape as schematically shown in FIG. 11B. Note that, although FIG. 11B shows a case where minute openings MA' each having an opening shape of a substantially rectangular shape are arranged in a triangular arrangement, it goes without saying that minute openings MA' each having an opening shape of a substantially rectangular shape may be arranged in a square arrangement like that shown in FIG. 11A.

Hereinabove, the structure of structural color filters and a pupil correction method according to the present embodiment are described in detail.

<With Regard to Structure of Pixel Array Section>

Next, the structure of a pixel array section including structural color filters according to the present embodiment like the above is specifically described with reference to FIG. 12 to FIG. 27C.

Figure 12:
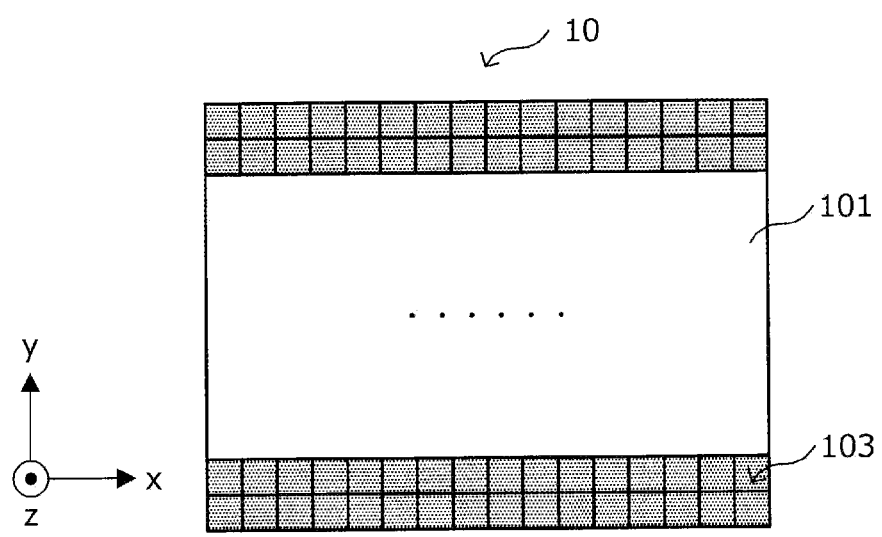
FIG. 12 is an explanatory diagram schematically showing a pixel array section of a solid-state imaging element according to the embodiment.
Figure 13:
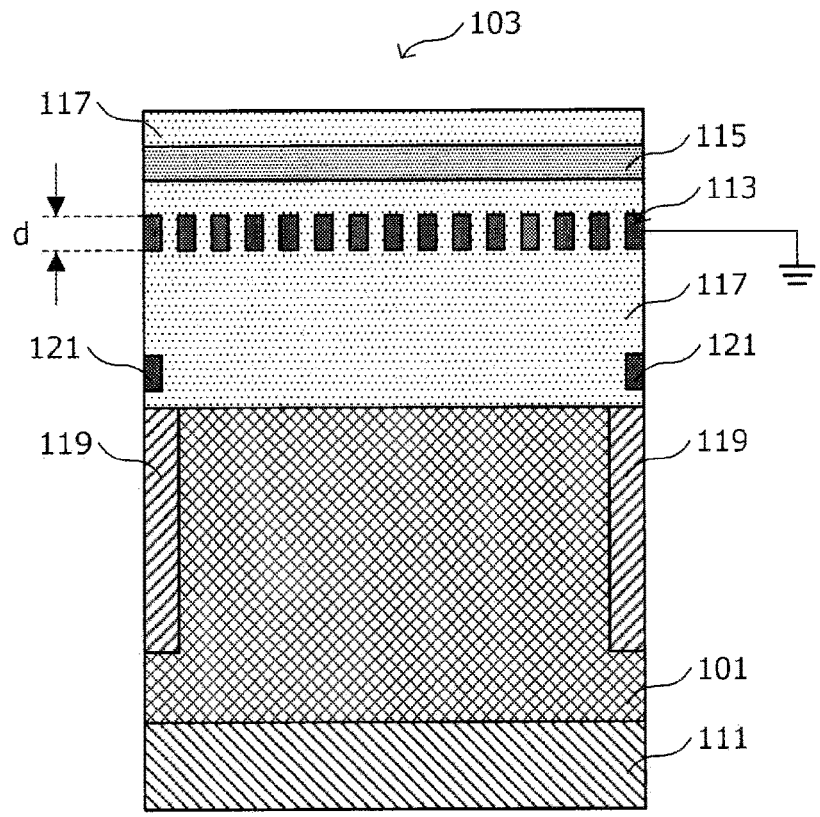
FIG. 13 is an explanatory diagram schematically showing an example of a structure of a single pixel in a pixel array section of a solid-state imaging element according to the embodiment.
Figure 14:
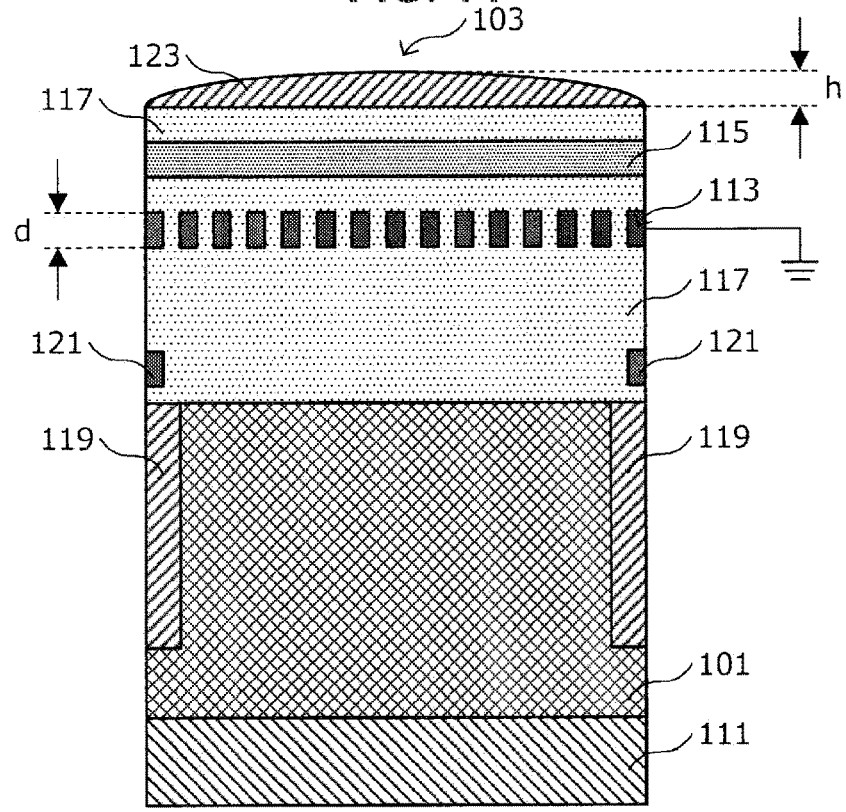
FIG. 14 is an explanatory diagram schematically showing another example of a structure of a single pixel in a pixel array section of a solid-state imaging element according to the embodiment.
Figure 15A:
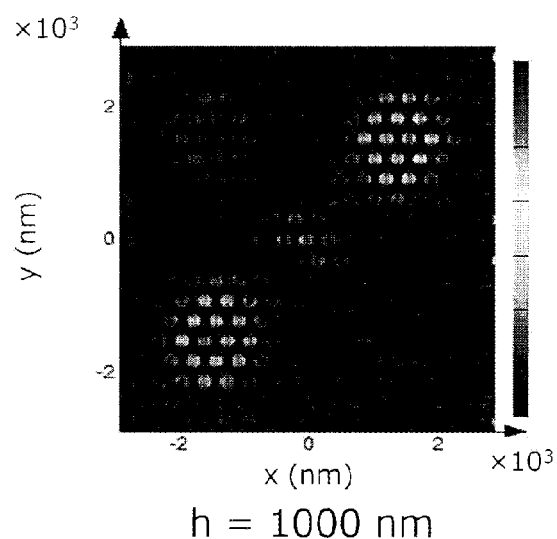
FIG. 15A is a graph showing an electric field intensity distribution after transmission through structural color filters in a pixel array section of a solid-state imaging element in which on-chip lenses each having a height of 1000 nm are provided.
Figure 15B:
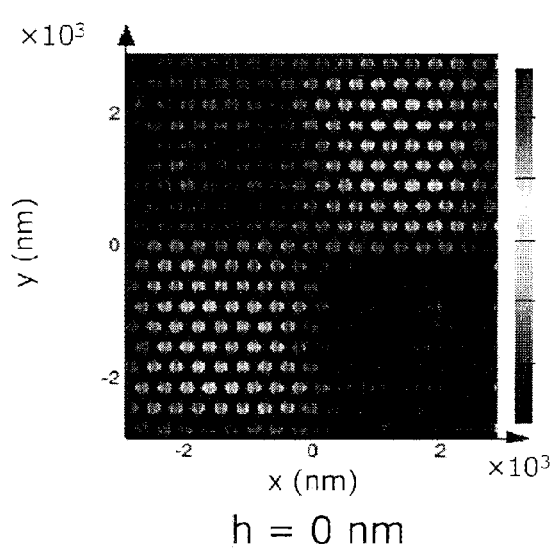
FIG. 15B is a graph showing an electric field intensity distribution after transmission through structural color filters in a pixel array section of a solid-state imaging element in which on-chip lenses are not provided.
Figure 16:
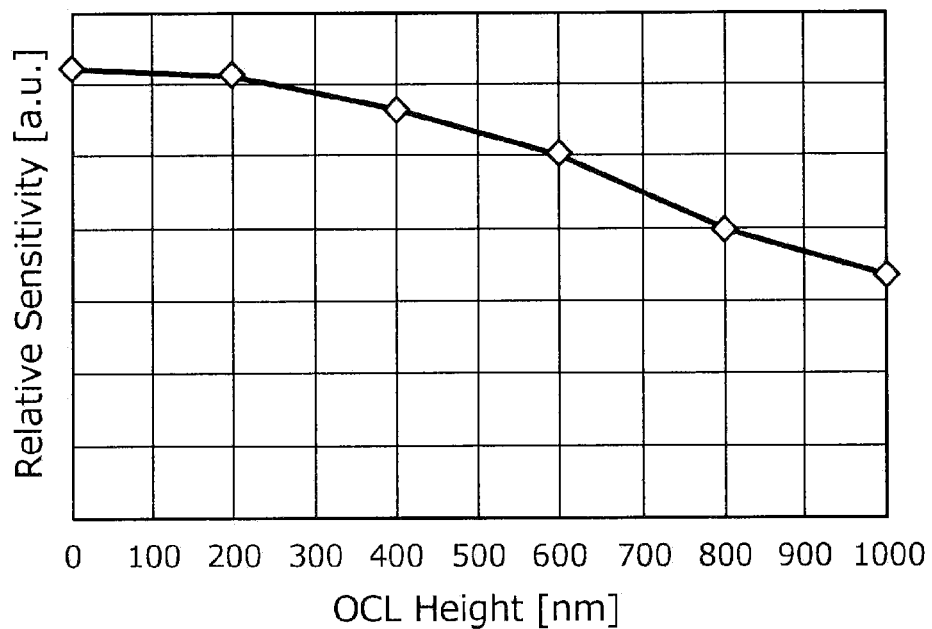
FIG. 16 is a graph showing a relationship between height and sensitivity of on-chip lenses.
Figure 17:
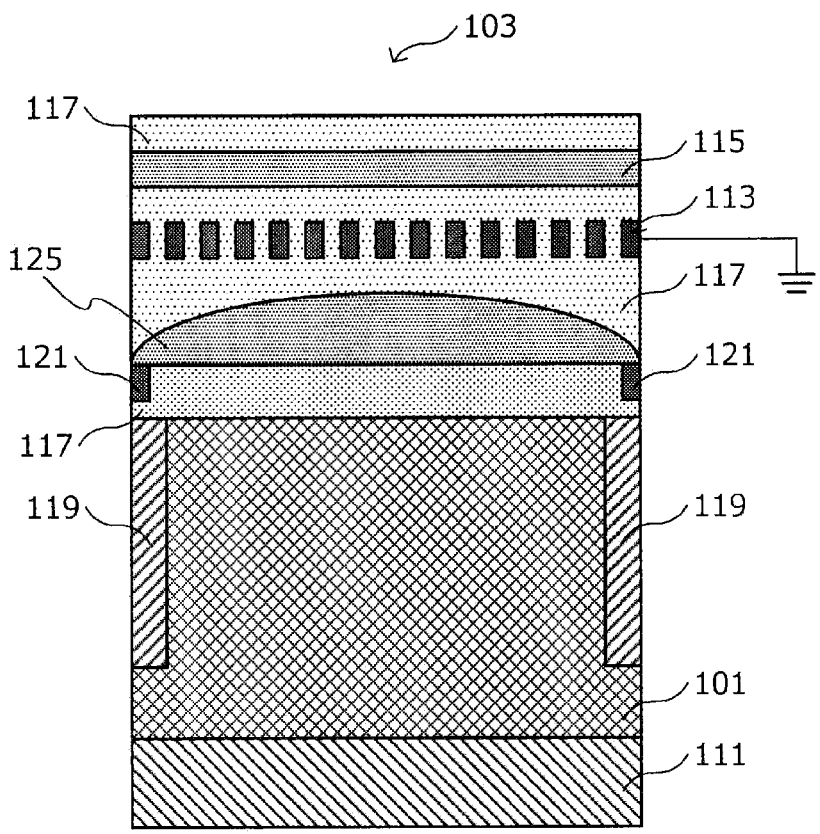
FIG. 17 is an explanatory diagram schematically showing another example of a structure of a single pixel in a pixel array section of a solid-state imaging element according to the embodiment.
Figure 18:
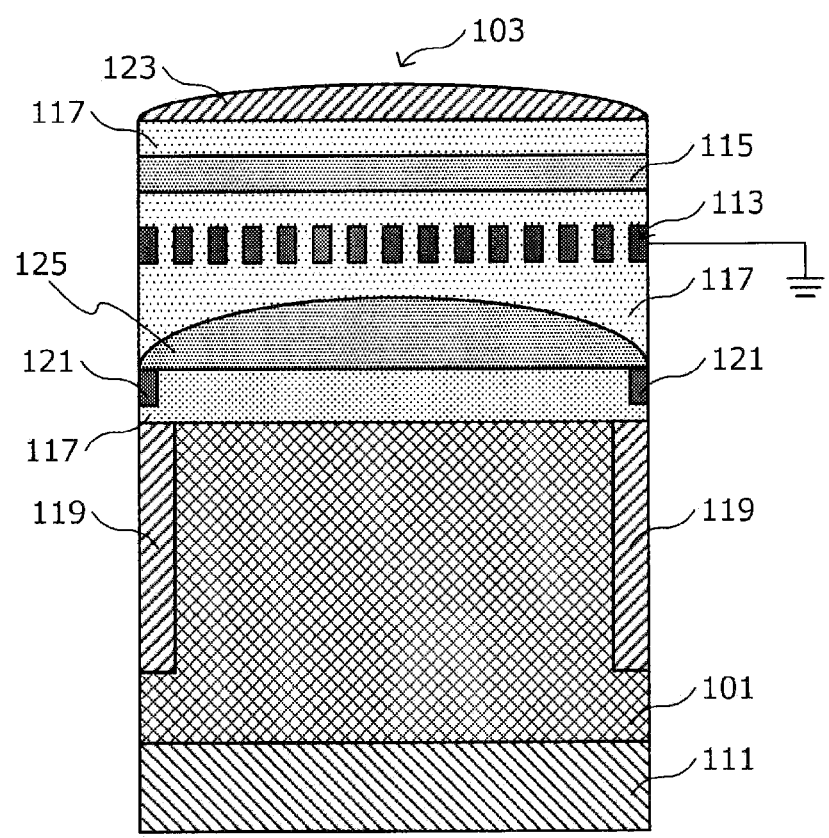
FIG. 18 is an explanatory diagram schematically showing another example of a structure of a single pixel in a pixel array section of a solid-state imaging element according to the embodiment.
Figure 19:
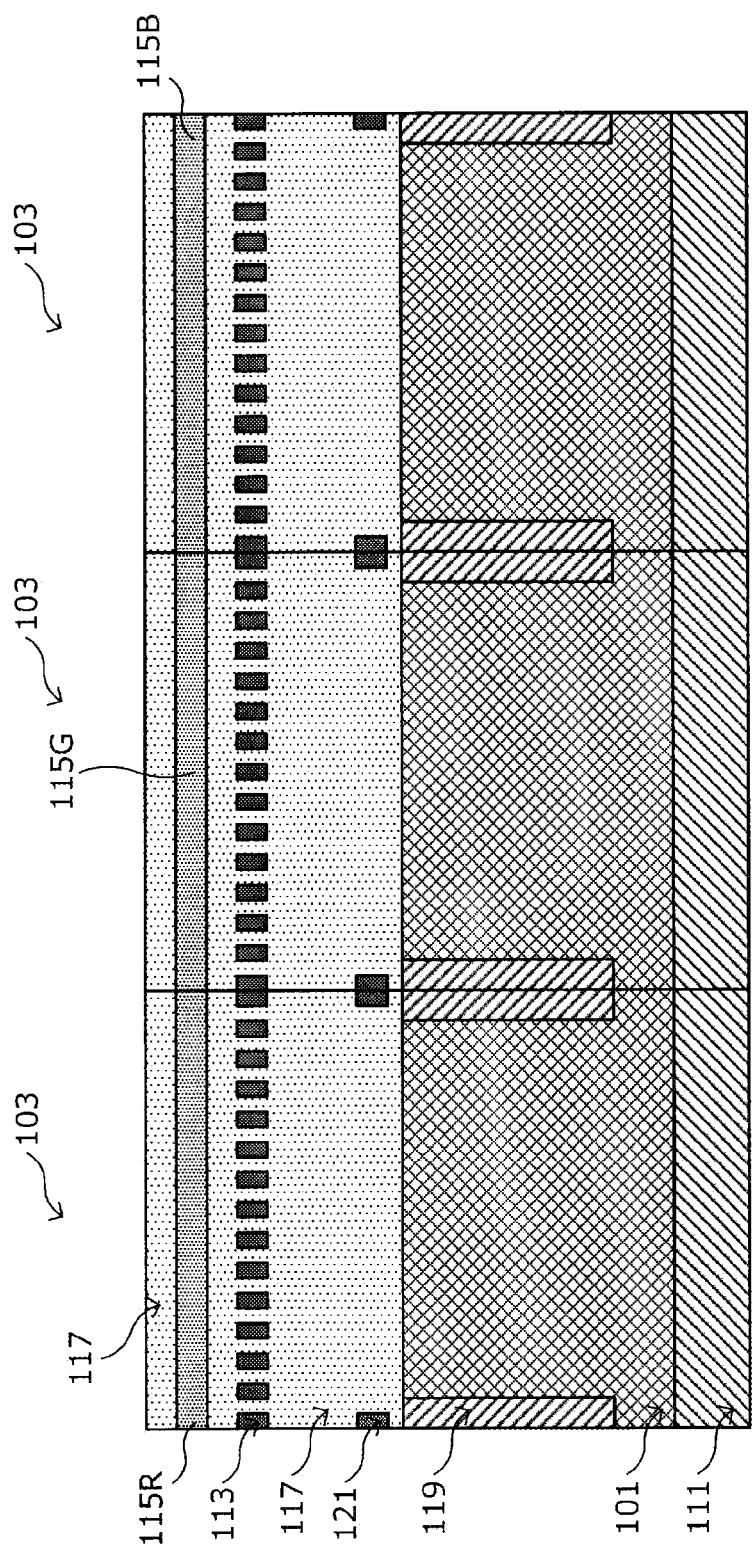
FIG. 19 is an explanatory diagram schematically showing an example of a pixel structure in a pixel array section of a solid-state imaging element according to the embodiment.

FIG. 12 is an explanatory diagram schematically showing a pixel array section of a solid-state imaging element according to the present embodiment, and FIG. 13 is an explanatory diagram schematically showing an example of the structure of a single pixel in the pixel array section of the solid-state imaging element according to the present embodiment. FIG. 14 is an explanatory diagram schematically showing another example of the structure of a single pixel in the pixel array section of the solid-state imaging element according to the present embodiment. FIG. 15A is a graph showing an electric field intensity distribution after transmission through structural color filters in the pixel array section of the solid-state imaging element in which on-chip lenses each having a height of 1000 nm are provided, and FIG. 15B is a graph showing an electric field intensity distribution after transmission through structural color filters in the pixel array section of the solid-state imaging element in which on-chip lenses are not provided. FIG. 16 is a graph showing a relationship between the height and the sensitivity of on-chip lenses. FIG. 17 and FIG. 18 are explanatory diagrams schematically showing other examples of the structure of a single pixel in the pixel array section of the solid-state imaging element according to the present embodiment. FIG. 19 is an explanatory diagram schematically showing an example of the pixel structure in the pixel array section of the solid-state imaging element according to the present embodiment, and FIG. 20 to FIG. 25 are explanatory diagrams schematically showing other examples of the pixel structure in the pixel array section of the solid-state imaging element according to the present embodiment. FIG. 26A to FIG. 27B are explanatory diagrams schematically showing examples of the arrangement state of structural color filters in the pixel array section of the solid-state imaging element according to the present embodiment, and FIG. 27C is an explanatory diagram schematically showing an arrangement state of color filters in the pixel array section of the solid-state imaging element according to the present embodiment.

As schematically shown in FIG. 12, the pixel array section 10 of the solid-state imaging element 100 according to the present embodiment is formed using a light receiving element 101, and a plurality of pixels 103 two-dimensionally arranged in a matrix configuration (array configuration) is provided in the light receiving element 101. If, as shown in FIG. 12, the light receiving element plane of the light receiving element 101 is defined as an xy plane for the sake of convenience and the height direction of the pixel array section 10 is defined as a z-axis positive direction for the sake of convenience, the plurality of pixels 103 are two-dimensionally arranged on the xy plane.

The pixel 103 of the pixel array section 10 according to the present embodiment includes, for example as schematically shown in FIG. 13, at least the light receiving element 101 included in a plurality of pixels, an interconnection layer 111 located below the light receiving element 101 and serving to acquire a signal of light detected by the light receiving element 101, and a structural color filter 113 located above at least part of the light receiving element 101 and including a metal film provided with a periodic opening pattern with a structural period smaller than a prescribed wavelength. Further, for example as schematically shown in FIG. 13, the pixel 103 of the pixel array section 10 according to the present embodiment preferably further includes a wavelength selection filter 115, flattening films 117, a trench structure 119, and a light blocking section 121.

The light receiving element 101 is a part functioning as the photodiode 1001 in the equivalent circuit diagram shown in FIG. 2. The light receiving element 101 may be formed using known semiconductors including compound semiconductors. Such a semiconductor is not particularly limited; in general, single-crystal silicon having a thickness (height in the z-axis direction) of approximately 3 µm is used in many cases. Such a semiconductor functions as a light absorbing layer that absorbs light belonging to the visible light region or the infrared light region.

Further, in the pixel 103 according to the present embodiment, a dielectric layer (not illustrated) containing a high-permittivity (high-k) material as a main component may be provided on a surface of the light receiving element 101. By providing such a dielectric layer, it becomes possible to pin the Fermi level of the semiconductor material used as the light receiving element 101, and it also becomes possible to make gentle the degree of change in refractive index between the flattening film 117 described later and the light receiving element 101. Note that the high-permittivity (high-k) material used for the dielectric layer is not particularly limited, and a known high-permittivity material may be used. Examples of such a high-permittivity material include various metal oxides such as $HfO_2$, which is a hafnium-based oxide, tantalum oxide ($Ta_2O_5$), aluminum oxide ($Al_2O_3$), and titanium oxide ($TiO_2$).

As shown in FIG. 13, the interconnection layer 111 for acquiring a signal of light detected by the light receiving element 101 is provided below the light receiving element 101. The detailed structure of the interconnection layer 111 is not particularly limited, and various structures for implementing various interconnection methods may be used, as appropriate. The signal of light detected by the light receiving element 101 is extracted to the outside via the interconnection layer 111, and is subjected to various pieces of signal processing.

On the other hand, it is preferable that flattening films 117 be provided above the light receiving element 101. By the flattening films 117 being provided, each of the contact between the light receiving element 101 and the structural color filter 113 and the contact between the structural color filter 113 and the wavelength selection filter 115 becomes good. Such a flattening film 117 may be formed using a dielectric material transparent to light of a wavelength region focused on. Such a dielectric material is not particularly limited; for example, a silicon oxide ($SiO_2$), a silicon nitride (SiN), or the like may be used.

Further, in the pixel 103 according to the present embodiment, it is preferable that, for the purpose of preventing color mixing between mutually adjacent pixels 103, the trench structure 119 that is an element isolation structure be formed near the end of the pixel 103.

Such a trench structure 119 may be a trench structure containing a dielectric material as a main component. Here, examples of the dielectric material used for the trench structure 119 include a dielectric material that reflects or absorbs visible light and near-infrared light, and a high-permittivity (high-k) material. The dielectric material that reflects or absorbs visible light and near-infrared light is not particularly limited; for example, a silicon oxide ($SiO_2$), a silicon oxynitride (SiON), a silicon nitride (SiN), or the like may be used. Further, as the high-permittivity (high-k) material, various metal oxides such as $HfO_2$, which is a hafnium-based oxide, tantalum oxide ($Ta_2O_5$), aluminum oxide ($Al_2O_3$), and titanium oxide ($TiO_2$) may be used.

Further, a metal trench structure containing, as a main component, a metal that reflects or absorbs visible light and near-infrared light may be provided as the trench structure 119 according to the present embodiment. Such a metal trench structure is obtained by filling a concave section formed as a trench structure with a metal that reflects or absorbs visible light and near-infrared light. Such a metal that reflects or absorbs visible light and near-infrared light is not particularly limited, and examples include at least one metal selected from the group consisting of tungsten, titanium, copper, and aluminum, and alloys of these.

By providing a trench structure 119 like that described above, light diffracted in the interior of the light receiving element 101 included in the unit pixel 103 can be prevented from being transmitted to an adjacent pixel 103, and as a result it becomes possible to prevent crosstalk between adjacent pixels.

Further, it is preferable that, in order to further prevent color mixing between mutually adjacent pixels 103, a light blocking section 121 be provided above the trench structure 119 like that mentioned above, as shown in FIG. 13.

As schematically shown in FIG. 13, a structural color filter 113 including a metal film provided with a periodic opening pattern with a structural period smaller than the wavelength of light detected by the light receiving element 101 is provided above the light receiving element 101. The structural color filter 113 is a structural color filter PF' like that described in detail with reference to FIG. 10 to FIG. 11B in which the structural period is different in accordance with the chief ray angle of incident light, specifically the structural period of the periodic opening pattern becomes smaller as the chief ray angle becomes larger, relative to the structural period of the periodic opening pattern at a chief ray angle of 0°.

By such structural color filters 113 being provided, in the solid-state imaging element 100 according to the present embodiment, pupil correction processing, which has so far not been performed by structural color filters, is performed, and the reduction in transmission efficiency can be suppressed in spite of using structural color filters; thus, the downsizing and thinning of the solid-state imaging element 100 can be achieved.

Here, the structural color filter 113 according to the present embodiment is preferably electrically grounded as schematically shown in FIG. 13.

Further, the thickness of the structural color filter 113 is preferably a thickness by which the structural color filter 113 is optically opaque at the wavelength of light incident on the structural color filter 113. Here, the specific thickness of the structural color filter 113 is not particularly limited; but the thickness is preferably within the range of 50 nm to 300 nm, and is more preferably approximately 150 nm, for example. Note that, in a case where the thickness of the structural color filter 113 is less than 50 nm, there is a possibility that the structural color filter 113 will be optically semitransparent. Further, if the thickness of the structural color filter 113 is more than 300 nm, there is a possibility that the intensity of light incident on the structural color filter 113 will be attenuated while the light passes through the opening portions provided in the structural color filter 113.

As shown in FIG. 13, it is preferable that a wavelength selection filter 115 for selecting a wavelength of light that is to be formed as an image on the light receiving element 101 be provided above the structural color filter 113. An absorption-type color filter that absorbs light of a prescribed wavelength is preferably used as the wavelength selection filter 115. By using, as the wavelength selection filter 115, an absorption-type color filter that absorbs light of a prescribed wavelength, the absorption-type color filter absorbs light of the prescribed wavelength, and can selectively transmit light of a wavelength in the visible light region. As a result, the absorption-type color filter selectively transmits light of a wavelength in the visible light region, and functions as, for example, a wavelength selection filter that selectively transmits red light, a wavelength selection filter that selectively transmits green light, or a wavelength selection filter that selectively transmits blue light.

Note that it is also possible to use, as absorption-type color filters like the above, color filters including a color filter that absorbs light of a prescribed wavelength and selectively transmits light in the visible light region and a white filter that is transparent to light (for example, ultraviolet light, visible light, near-infrared light, etc.) in an electromagnetic wave wavelength region in which the light receiving element has sensitivity.

An absorption-type color filter used as the wavelength selection filter 115 like the above is not particularly limited, and the absorption-type color filter may be formed using a known organic-based material or inorganic-based material that transmits light in a wavelength region in which image formation is intended to be performed on a focused-on pixel 103 and absorbs light in other wavelength regions, in accordance with the wavelength region.

Further, as schematically shown in FIG. 13, a flattening film 117 may be further provided on the wavelength selection filter 115 so that the surface of the pixel 103 is flattened.

Here, in an ordinary two-dimensional solid-state imaging element, each pixel generally includes a light collecting element in order to introduce light into a light receiving element with good efficiency. On the other hand, in a case where a structural color filter utilizing surface plasmon polaritons like that focused on in the present embodiment is used for a solid-state imaging element, it is important to pay attention to the respects described below.

FIG. 14 shows a pixel structure in a case where the pixel 103 including the structural color filter 113 according to the present embodiment includes a light collecting element (what is called a light collecting structure element (on-chip-lens, OCL)) 123. As is clear from FIG. 14, a light collecting element 123 for causing light incident on the pixel 103 to be appropriately formed as an image on the light receiving element 101 is provided above the wavelength selection filter 115 and the flattening film 117. The light collecting element 123 is an example of a second light collecting lens structure.

The light collecting element 123 has a curved surface having a certain curvature; the curved surface focuses on a central portion of each pixel, and thereby interference with an obstacle or the like between pixels is lessened; as a result, high aperture efficiency can be maintained.

FIG. 15A shows the result of a simulation of an electric field intensity distribution on the back surfaces (that is, the surfaces on the light receiving element 101 side) of the structural color filters 113 in pixels including light collecting elements 123 each having a height (h in FIG. 14) of 1000 nm. Here, in the simulation, four pixels 103 including 2×2 structural color filters 113 are envisaged, and it is assumed that a light absorption-type filter containing an organic-based material or an inorganic-based material of RGB is provided as the wavelength selection filter 115 above the structural color filter 113. Further, it is assumed that a wavelength selection filter 115 that selectively transmits green light is located in each of the pixels located at the upper right and the lower left in FIG. 15A, and a case where green light is incident on the four pixels 103 is envisaged.

In the result shown in FIG. 15A, it can be seen that the transmittance of green light is small in the pixel located at the upper left and the pixel located at the lower right because a wavelength selection filter 115 that transmits red light and a wavelength selection filter 115 that transmits blue light exist in these pixels, respectively. On the other hand, in the pixel in which a wavelength selection filter 115 that transmits green light exists, a situation where the electric field distribution forms a spot in a size smaller than the pixel size due to the light collecting element 123 is seen. In a structural color filter typified by a plasmonic filter, the transmission wavelength and the transmission efficiency are decided by interference between adjacent opening portions; therefore, it can be seen that, if light comes to a focus in a small size, the transmission efficiency in an outer peripheral portion of the structural color filter is small, and consequently the transmission efficiency or the sensor sensitivity as a whole is low.

FIG. 16 shows the result of a simulation of sensor sensitivity in a case where the height h of the light collecting element 123 is made variable. As is clear from FIG. 16, it can be seen that the sensitivity rises as the height h of the light collecting element 123 becomes thinner (in other words, as the curvature of the curved surface of the light collecting element 123 becomes larger). Further, FIG. 15B shows the result of an electric field intensity distribution at a limit at which the height h of the light collecting element 123 is thinnest (that is, a flat surface corresponding to a case where the curvature of the curved surface is in other words, a case where the light collecting element 123 is not provided). As can be seen from FIG. 15B and FIG. 16, it is found that in a case where the light collecting element 123 is not provided, light is applied to the entire surface of the structural color filter, and consequently the transmission efficiency is maximized.

From such a point of view, extensive studies were conducted on the height h of the light collecting element 123 in a case where the light collecting element 123 is provided; as a result, it has been revealed that the height h of the light collecting element 123 is preferably set to approximately 10% to 30% of the size of the pixel 103 (pixel size).

In a pixel 103 like that shown in FIG. 13 in a case where the light collecting element 123 is not provided, an electric field intensity distribution like that shown as an example in FIG. 15B is obtained; however, even in such a case, it is important to introduce light transmitted through the structural color filter 113 into the light receiving element 101 with good efficiency. Hence, as schematically shown in FIG. 17, it is preferable that an in-layer lens 125 be provided between the surface on the light receiving element 101 side of the structural color filter 113 and the light receiving element 101, as a first light collecting lens structure. Here, the refractive index of the in-layer lens 125 is preferably a value larger than the refractive index of the place (that is, the flattening film 117) around the place where the in-layer lens 125 is provided. By providing such an in-layer lens 125, light transmitted through the structural color filter 113 can be collected to the light receiving element 101 with good efficiency, and the sensitivity of the pixel 103 including the structural color filter 113 according to the present embodiment can be maximized.

Further, it goes without saying that both of a light collecting element 123 and an in-layer lens 125 like the above may be provided for the pixel 103 in the solid-state imaging element 100 according to the present embodiment, as schematically shown in FIG. 18. Note that, in a case where both of the light collecting element 123 and the in-layer lens 125 are provided for the pixel 103, it is preferable than the curvature of the curved surface of the light collecting element 123 be set larger than the curvature of the curved surface of the in-layer lens 125 (in other words, the height of the light collecting element 123 be set lower than the height of the in-layer lens 123). By the curvatures of the curved surfaces of the light collecting element and the in-layer lens 125 being set in a relationship like the above, light transmitted through the structural color filter 113 can be introduced into the light receiving element 101 with better efficiency.

[Specific Examples of Pixel Array Section]

In the following, the structure of the pixel array section 10 according to the present embodiment is described more specifically with reference to FIG. 19 to FIG. 25.

FIG. 19 is an example of the structure of the pixel array section 10 in a case of not including the light collecting element 123 or the in-layer lens 125. In the example shown in FIG. 19, each pixel 103 has obtained a flat surface by a flattening film 117 being provided in the outermost layer, and wavelength selection filter 115R, 115G, or 115B is provided below the flattening film 117. Here, wavelength selection filter 115R is a wavelength selection filter including an absorption-type color filter that transmits red light, wavelength selection filter 115G is a wavelength selection filter including an absorption-type color filter that transmits green light, and wavelength selection filter 115B is a wavelength selection filter including an absorption-type color filter that transmits blue light. Further, a structural color filter 113 according to the present embodiment like that described in detail with reference to FIG. 10 to FIG. 11B is provided below each wavelength selection filter 115. Further, a light receiving element 101 including a light absorbing layer using, for example, crystalline silicon or the like is provided below the structural color filter 113, and the interconnection layer 111 is provided further below the light receiving element 101. Further, the trench structure 119 is provided between mutually adjacent parts of the light receiving element 101, and the light blocking section 121 is provided above each trench structure 119.

Figure 20:
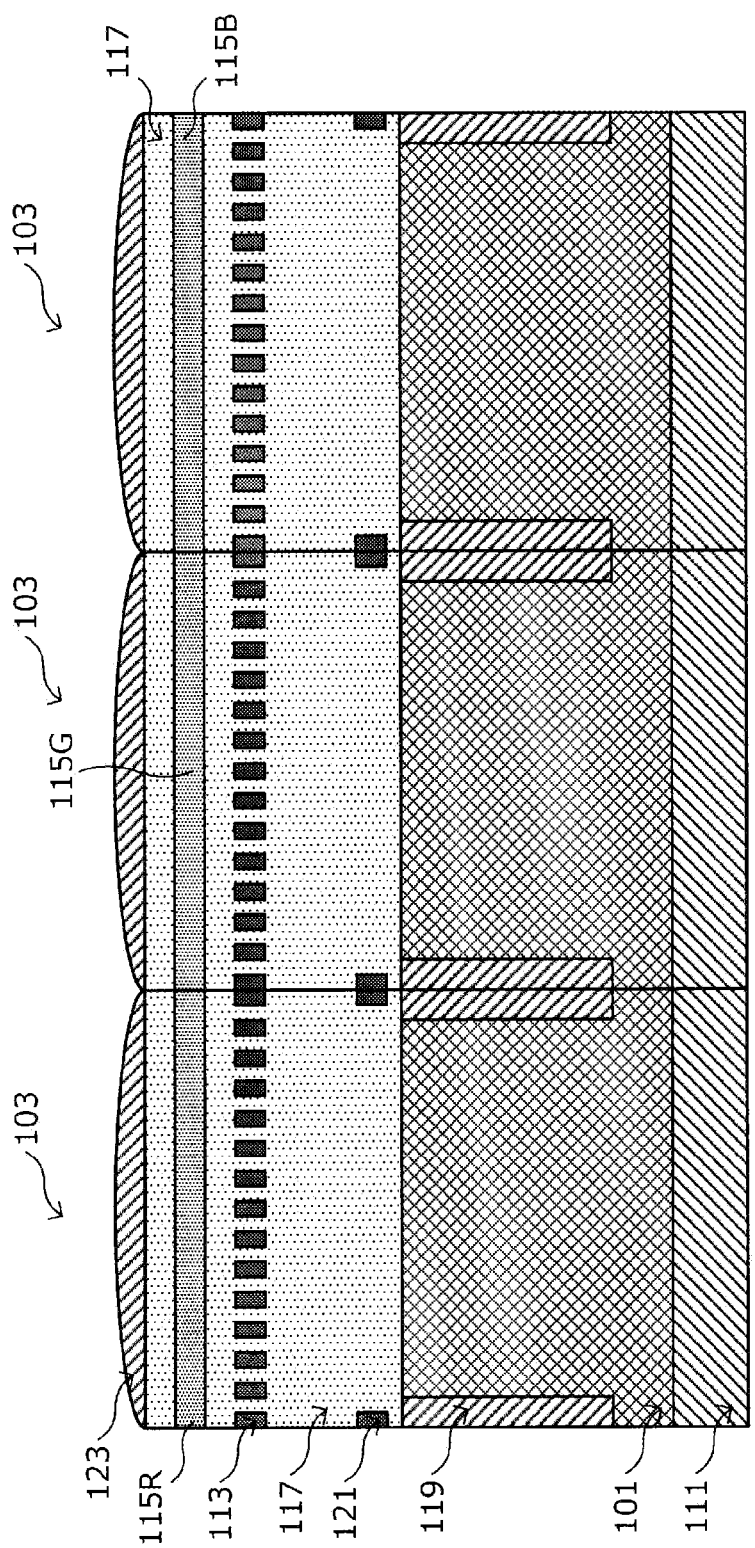
FIG. 20 is an explanatory diagram schematically showing another example of a pixel structure in a pixel array section of a solid-state imaging element according to the embodiment.

FIG. 20 is an example of a structure in a case where the light collecting element 123 is provided in the outermost layer of the pixel 103 shown in FIG. 19. In the example shown in FIG. 20, an on-chip-type light collecting element 123 is provided in the outermost layer of each pixel 103, and wavelength selection filter 115R, 115G, or 115B is provided below each light collecting element 123 via the flattening film 117. Further, a structural color filter 113 according to the present embodiment like that described in detail with reference to FIG. 10 to FIG. 11B is provided below each wavelength selection filter 115. Further, a light receiving element 101 including a light absorbing layer using, for example, crystalline silicon or the like is provided below the structural color filter 113, and the interconnection layer 111 is provided further below the light receiving element 101. Further, the trench structure 119 is provided between mutually adjacent parts of the light receiving element 101, and the light blocking section 121 is provided above each trench structure 119.

Figure 21:
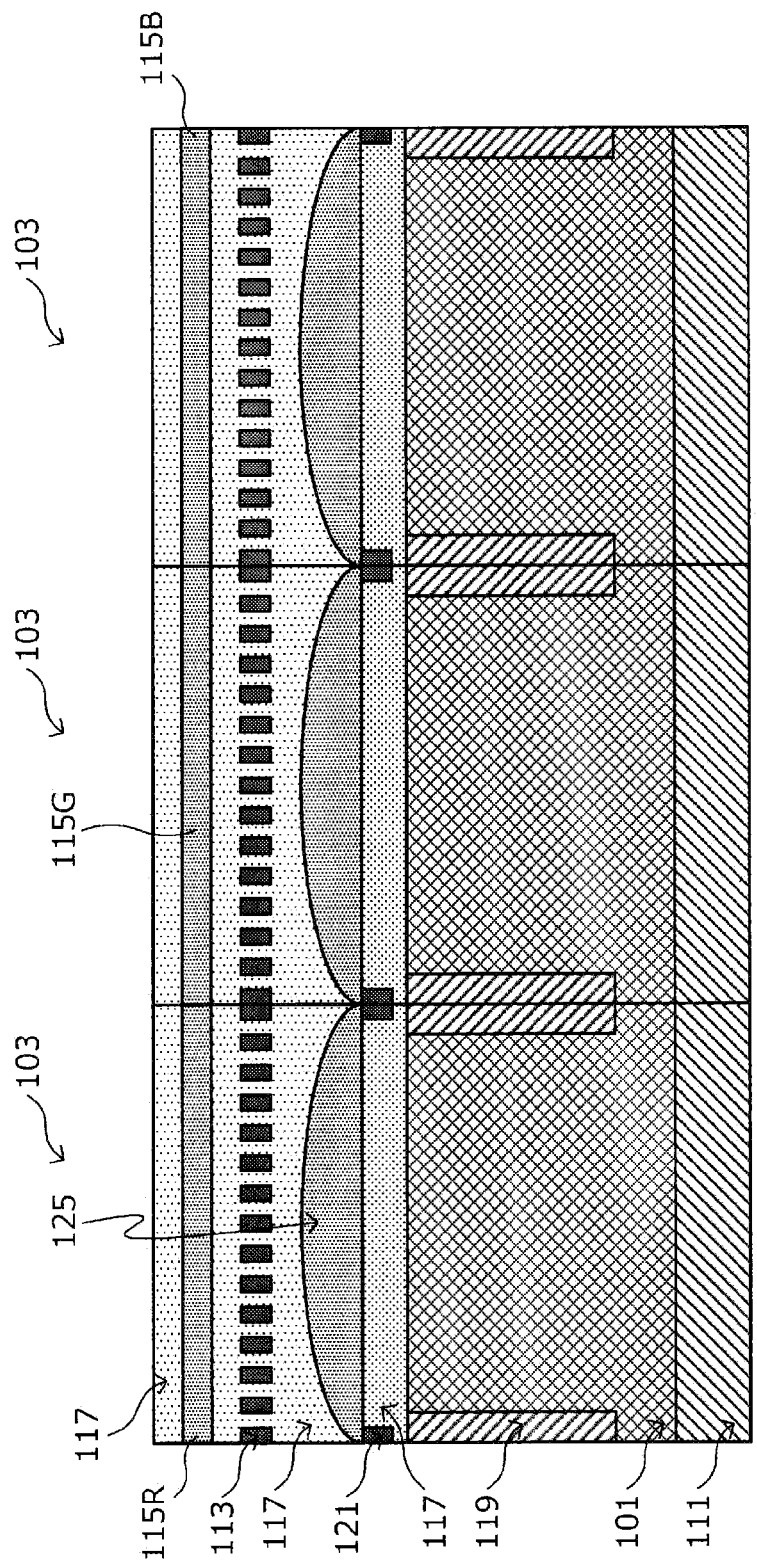
FIG. 21 is an explanatory diagram schematically showing another example of a pixel structure in a pixel array section of a solid-state imaging element according to the embodiment.

FIG. 21 is an example of a structure in a case where the in-layer lens 125 is provided for the pixel 103 shown in FIG. 19. In the example shown in FIG. 21, each pixel 103 has obtained a flat surface by a flattening film 117 being provided in the outermost layer, and wavelength selection filter 115R, 115G, or 115B is provided below the flattening film 117. Further, a structural color filter 113 according to the present embodiment like that described in detail with reference to FIG. 10 to FIG. 11B is provided below each wavelength selection filter 115, and the in-layer lens 125 is provided below the structural color filter 113 via a flattening film 117. Further, a light receiving element 101 including a light absorbing layer using, for example, crystalline silicon or the like is provided below the in-layer lens 125 via a flattening film 117, and the interconnection layer 111 is provided further below the light receiving element 101. Further, the trench structure 119 is provided between mutually adjacent parts of the light receiving element 101, and the light blocking section 121 is provided in a place located above each trench structure 119 and below the in-layer lens 125.

Figure 22:
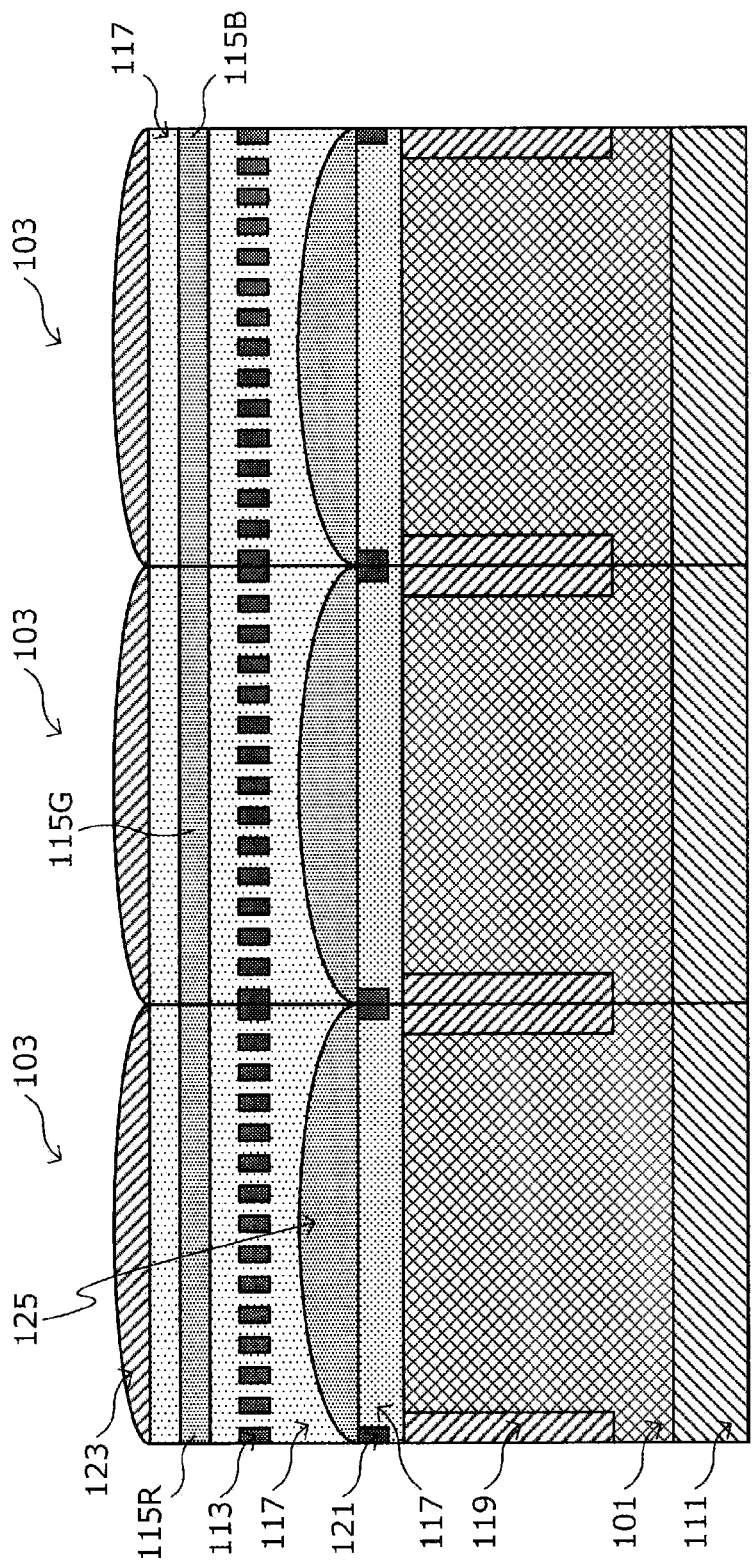
FIG. 22 is an explanatory diagram schematically showing another example of a pixel structure in a pixel array section of a solid-state imaging element according to the embodiment.

FIG. 22 is an example of a structure in a case where the light collecting element 123 and the in-layer lens 125 are provided for the pixel 103 shown in FIG. 19. In the example shown in FIG. 22, an on-chip-type light collecting element 123 is provided in the outermost layer of each pixel 103, and wavelength selection filter 115R, 115G, or 115B is provided below each light collecting element 123 via a flattening film 117. Further a structural color filter 115 according to the present embodiment like that described in detail with reference to FIG. 10 to FIG. 11B is provided below each wavelength selection filter 115. Further, the in-layer lens 125 is provided below the structural color filter 113 via a flattening film 117, and a light receiving element 101 including a light absorbing layer using, for example, crystalline silicon or the like is provided below the in-layer lens 125 via a flattening film 117. Further, the interconnection layer 111 is provided further below the light receiving element 101. Further, the trench structure 119 is provided between mutually adjacent parts of the light receiving element 101, and the light blocking section 121 is provided in a place located above each trench structure 119 and below the in-layer lens 125.

Figure 23:
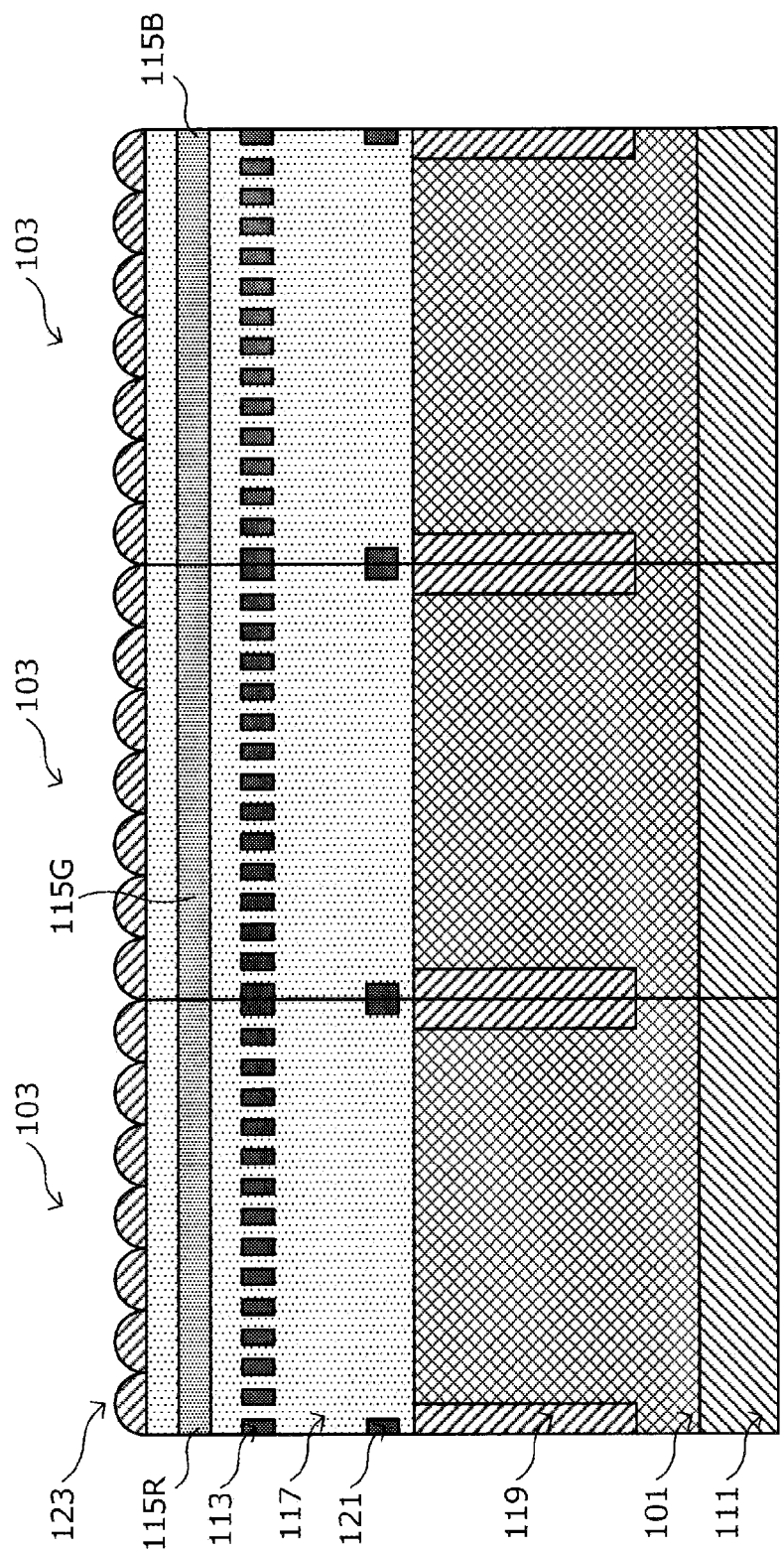
FIG. 23 is an explanatory diagram schematically showing another example of a pixel structure in a pixel array section of a solid-state imaging element according to the embodiment.

Here, the light collecting element 123 provided in each pixel 103 is not limited to one like those shown in FIG. 20 and FIG. 22, and N light collecting elements each smaller than the pixel may be provided in each of the vertical direction and the horizontal direction for one pixel as schematically shown in FIG. 23, for example.

Figure 24:
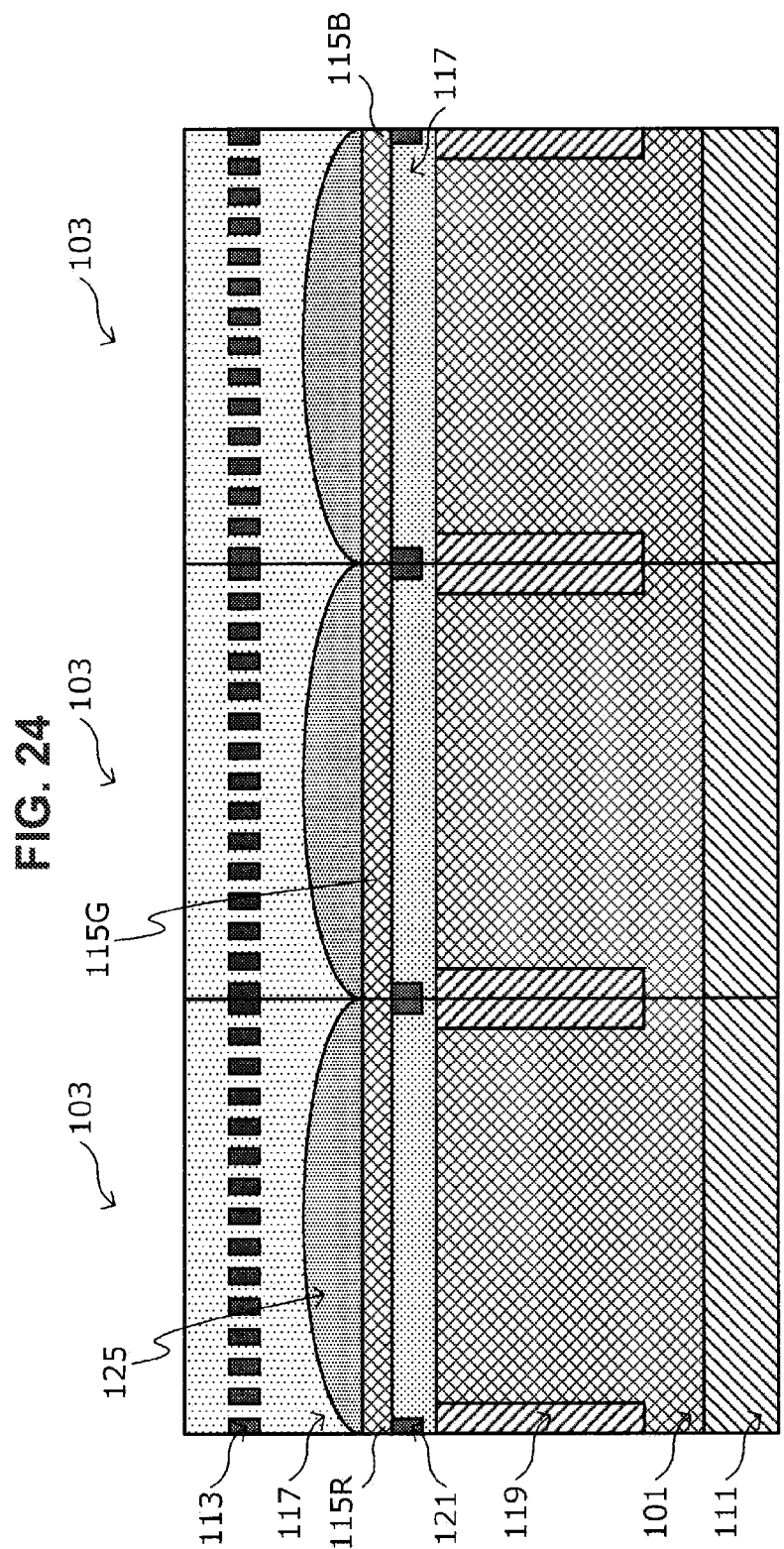
FIG. 24 is an explanatory diagram schematically showing another example of a pixel structure in a pixel array section of a solid-state imaging element according to the embodiment.

Further, the position of the wavelength selection filter 115 is not limited to the positions shown in FIG. 10 to FIG. 23 either, and the wavelength selection filter 115 may be provided in an arbitrary position as long as it is above the light receiving element 101; for example, as shown in FIG. 24, the wavelength selection filter 115 may be provided in a position below the structural color filter 113 and the in-layer lens 125 and above the light receiving element 101. However, the structural color filter 113 according to the present embodiment has the characteristics of transmitting light of a specific wavelength and furthermore reflecting or absorbing light of other wavelengths. Hence, there is a possibility that light reflected by the structural color filter 113 will become a stray light component to surrounding pixels. Hence, although the placement position of the wavelength selection filter 115 may be an arbitrary position as long as it is above the light receiving element 101, the wavelength selection filter 115 is preferably provided above the structural color filter 113. By the existence of the wavelength selection filter 115 above the structural color filter 113, the wavelength selection filter 115 functions as a band-pass filter, and the ratio of reflected components in the light components incident on the structural color filter 113 can be greatly reduced. As a result, the reduction in image quality derived from a stray light component can be suppressed.

Figure 25:
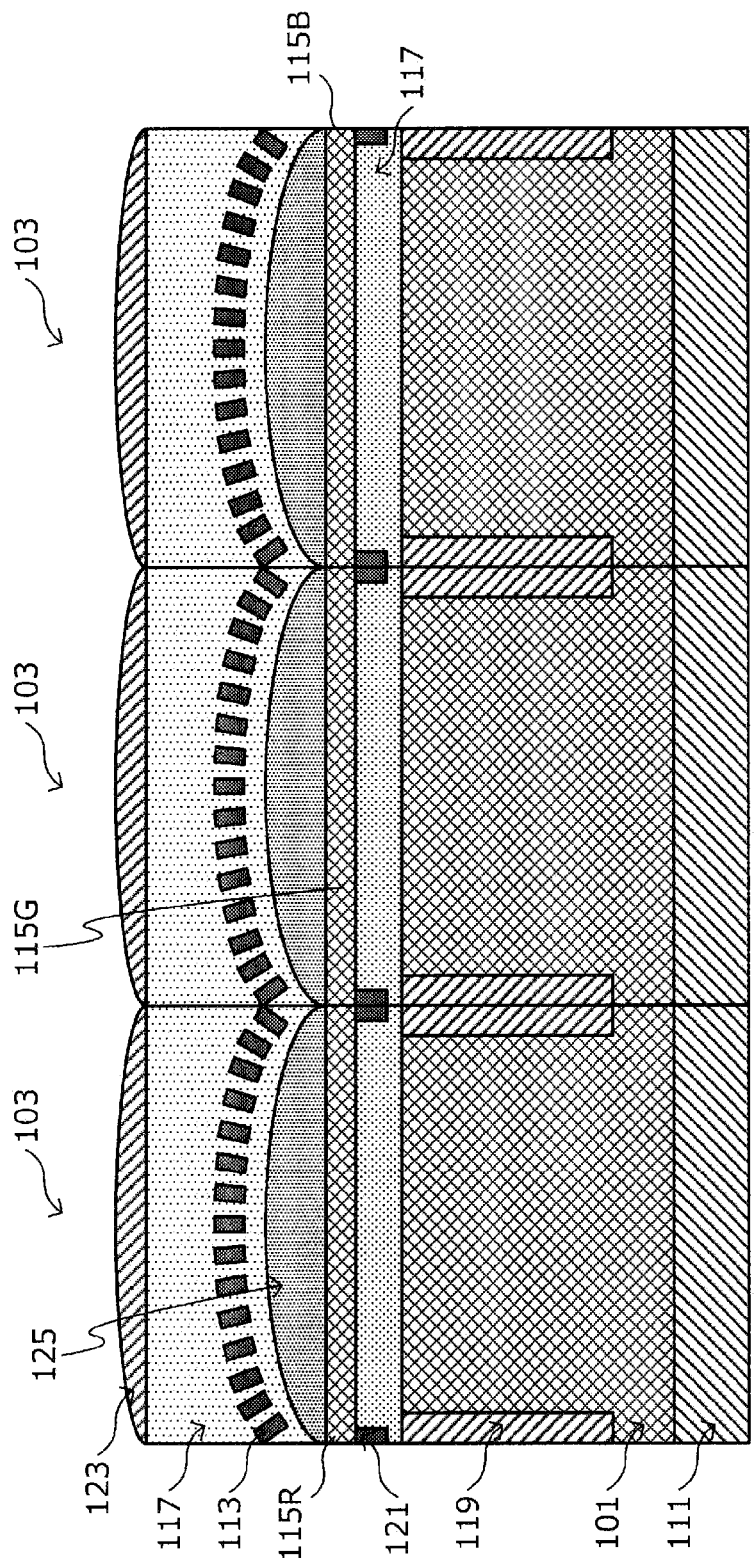
FIG. 25 is an explanatory diagram schematically showing another example of a pixel structure in a pixel array section of a solid-state imaging element according to the embodiment.

Further, in the examples described hereinabove, the aperture surface of the structural color filter 113 according to the present embodiment is shown by taking up a case where the aperture surface of the structural color filter 113 is substantially parallel to the aperture surface of the light receiving element 101; however, as shown in FIG. 25, the surface shape of the aperture surface of the structural color filter 113 may be curved so as to be similar to the surface shape of the in-layer lens 125. By using such a shape, the change in the optical characteristics of the structural color filter 113 can be further suppressed even if light incident obliquely to the structural color filter 113 exists.

Hereinabove, the structure of the pixel array section 10 according to the present embodiment is described more specifically with reference to FIG. 19 to FIG. 25.

[Arrangement Examples of Structural Color Filters in Pixel Array Section]

In the following, arrangement examples of structural color filters 113 in the pixel array section 10 according to the present embodiment are specifically described with reference to FIG. 26A to FIG. 27C.

Figures 26A, 26B:
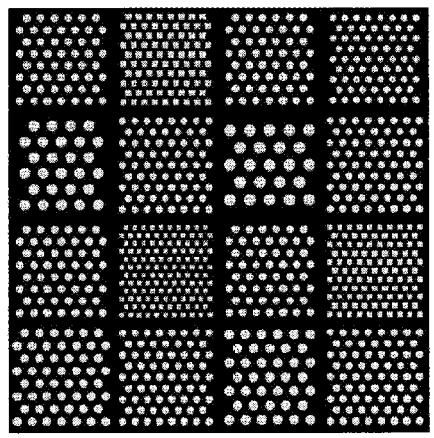
FIG. 26A is an explanatory diagram schematically showing an example of an arrangement state of structural color filters in a pixel array section of a solid-state imaging element according to the embodiment.
FIG. 26B is an explanatory diagram schematically showing an example of an arrangement state of structural color filters in a pixel array section of a solid-state imaging element according to the embodiment.

FIG. 26A and FIG. 26B show an arrangement example of structural color filters 113 in a case where 4 pixels vertically×4 pixels horizontally are included in one pixel unit. In this case, a maximum of 16 kinds of structural color filters 113 can be arranged for one pixel unit. In this event, in a case where the wavelength region of light transmitted through the structural color filter is the visible light region, if structural color filters 113 of which the transmission peak wavelengths are near that of green light are arranged in a checkered pattern like G pixels in the Bayer arrangement, compatibility with signal processing of a common color image sensor is high, and this is preferable. In this case, structural color filters 113 having, for example, 16 kinds of periodic structural pasterns like those shown in FIG. 26A are arranged, and the pixel unit can be made to function as shown in FIG. 26B. However, it goes without saying that structural color filters 113 may be arranged in a filter arrangement other than the Bayer arrangement, and a larger number of structural color filter groups, such as 6×6=36 kinds or 8×8=64 kinds, can be made to function as one pixel unit.

Figure 27A:
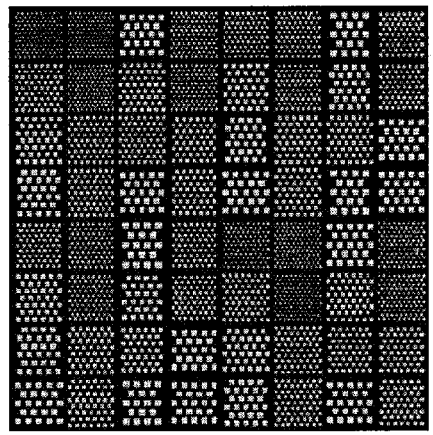
FIG. 27A is an explanatory diagram schematically showing an example of an arrangement state of structural color filters in a pixel array section of a solid-state imaging element according to the embodiment.

FIG. 27A and FIG. 27B schematically show an arrangement example of structural color filters 113 in a case where 8×8=64 pixels are included in one pixel unit. In this case, a maximum of 64 kinds of structural color filters 113 can be arranged for one pixel unit, but FIG. 27A and FIG. 27B schematically show a case where 15 kinds of structural color filters 113 are arranged. In this event, in a case where the wavelength region of light transmitted through the structural color filter is the visible light region, if structural color filters 113 of which the transmission peak wavelengths are near that of green light are arranged in a checkered pattern like G pixels in the Bayer arrangement, compatibility with signal processing of a common color image sensor is high, and this is preferable; but it goes without saying that a filter arrangement other than the Bayer arrangement may be employed.

Further, by combining a group of structural color filters 113 like that shown in FIG. 27A and FIG. 27B and a group of wavelength selection filters 115 using absorption-type color filters like that shown in FIG. 27C, the number of combinations of filters can be increased to a total of N×M kinds, i.e., N kinds of wavelength selection filters×M kinds of structural color filters. Furthermore, a component other than a desired transmission region can be absorbed by an absorption-type color filter, and therefore the amount of reflected components at the structural color filter 113 can be reduced. Information in finer wavelength directions can be acquired by using a solid-state imaging element using such a combination of wavelength selection filters 115 and structural color filters 113 for a multispectral camera or a multicolor camera capable of acquiring spectrum information.

<With Regard to Configurations of Imaging Devices>

Next, configurations of an imaging device 1 including the solid-state imaging element 100 according to the present embodiment are briefly described with reference to FIG. 28. FIG. 28 is explanatory diagrams schematically showing configurations of imaging devices each including a solid-state imaging element according to the present embodiment.

The imaging device 1 according to the present embodiment includes at least a solid-state imaging element 100 like that described above and an optical system 200 that guides light to the solid-state imaging element 100.

Examples of such an imaging device 1 include an imaging device 1 like that shown in FIG. 28. In the present example, a pixel array section 10 including, in at least part of the pixels, structural color filters 113 according to the present embodiment like that described above is provided in the solid-state imaging element 100. The number of functions of the solid-state imaging element 100 can be increased by partially providing structural color filters 113 according to the present embodiment in at least part of the pixels of the pixel array section 10.

If incident light is incident on the optical system 200, an image is formed on the pixel array section 10 of the solid-state imaging element 100 by an arbitrary optical lens group 230 controlled by a lens control section 210, and an image output from the pixel array section 10 is subjected to various pieces of signal processing by to the signal processing section 60. After that, the image output subjected to signal processing is stored in the data storage section 70 or a storage provided outside the solid-state imaging element 100. Further, the driving of the pixel array section 10 and the lens control section 210 provided in the imaging device 1 is controlled by, for example, the system control section 50.

Here, in the solid-state imaging element 100 according to the present embodiment, pupil correction has been made appropriately by structural color filters 113 according to the present embodiment being provided, and therefore the reduction in transmission efficiency can be suppressed in spite of using structural color filters.

Further, an imaging device 1 like that described hereinabove can be mounted on various information processing devices typified by portable computers and personal digital assistants such as smartphones.

<With Regard to Method for Manufacturing Solid-State Imaging Element>

Next, a method for manufacturing a solid-state imaging element according to the present embodiment is briefly described.

In a method for manufacturing a solid-state imaging element according to the present embodiment, first, opening portions each having a prescribed opening shape are formed in a metal thin film like the above in such a manner that the structural period of the periodic opening pattern becomes smaller as the chief ray angle becomes larger, relative to the structural period of the periodic opening pattern at a chief ray angle of 0°. After that, a dielectric layer using a dielectric like that described above is formed on a surface of the metal thin film in which the periodic opening pattern is formed, and the resulting piece is used as the structural color filter 113.

After that, intermediate layers such as flattening films 117 and in-layer lenses 125 are formed on a surface of a base material functioning as a light receiving element by using a known method such as the chemical vapor deposition (CVD) method, the plasma-enhanced chemical vapor deposition (PCVD) method, the atomic layer deposition (ALD) method, vacuum vapor deposition, or sputtering, and structural color filters 113 mentioned above are arranged on the intermediate layers. After that, wavelength selection filters 115 and light collecting elements 123 are sequentially formed using known materials like those described above. Thereby, the pixel array section 10 of the solid-state imaging element 100 according to the present embodiment can be manufactured.

Hereinabove, a method for manufacturing a solid-state imaging element according to the present embodiment is briefly described.

Conclusions

As described hereinabove, in a solid-state imaging element according to an embodiment of the present disclosure, uniform optical characteristics in which the amounts of change in optical characteristics (that is, wavelength shifts and sensitivity shading) are small from a central region (a low image height region) to an outer peripheral region (a high image height region) of a two-dimensional pixel array can be obtained in terms of fabricating a camera system including a lens module. Further, the uniformity of the optical characteristics of the structural color filters in various regions is enhanced, and therefore the burden of the processing of correcting the optical characteristics can be lessened.

Further, in a structural color filter typified by a plasmonic filter, the transmission efficiency is decided by the interference of surface plasmon polaritons between neighboring opening portions; therefore, there is a possibility that the transmission efficiency will not be brought out to the fullest in a case where a spot is formed in a small size on the surface of the filter. Thus, the in-layer lens 125 is provided in the pixel; thereby, while light is applied to a large area of the aperture surface of the structural color filter 113, components of light transmitted through the structural color filter 113 can be caused to be collected to the light receiving element 101 with good efficiency; as a result, the system sensitivity of the device can be maximized.

Furthermore, in a case where the number of lands of structural color filters provided as the whole pixel unit is set to M and the number of kinds of wavelength selection filters is set to N, the number of kinds of combinations of filters is N×M; thus, a very large number of combinations of filters can be achieved. Further, the structural color filter 113 has the characteristics of transmitting a specific wavelength and furthermore reflecting or absorbing other wavelength components, and a reflected component becomes a stray light component; however, the intensity of reflected components at the structural color filter 113 can be lessened and the reduction in image quality can be lessened by providing a wavelength selection filter 115 including an absorption-type color filter above the structural color filter 113.

The preferred embodiment(s) of the present disclosure has/have been described above with reference to the accompanying drawings, whilst the present disclosure is not limited to the above examples. A person skilled in the art may find various alterations and modifications within the scope of the appended claims, and it should be understood that they will naturally come under the technical scope of the present disclosure.

Further, the effects described in this specification are merely illustrative or exemplified effects, and are not limitative. That is, with or in the place of the above effects, the technology according to the present disclosure may achieve other effects that are clear to those skilled in the art from the description of this specification.

Additionally, the present technology may also be configured as below.

(1)

A solid-state imaging element including:

a light receiving element included in a plurality of pixels;

structural color filters located above at least part of the light receiving element and each including a metal film provided with a periodic opening pattern with a structural period smaller than a prescribed wavelength; and an interconnection layer located below the light receiving element and configured to acquire a signal of light detected by the light receiving element, in which the structural period is different between the structural color filters in accordance with a chief ray angle of incident light, and the structural period of the periodic opening pattern becomes smaller as the chief ray angle becomes larger, relative to the structural period of the periodic opening pattern at the chief ray angle of 0°.

(2)

The solid-state imaging element according to (1), in which the structural color filter is a structural filter utilizing surface plasmon polaritons generated at an interface between a metal surface and a dielectric.

(3)

The solid-state imaging element according to (1) or (2), in which the periodic opening pattern in the structural color filter includes a plurality of opening portions each having an opening shape of a circular shape or a rectangular shape, and the respective opening portions are provided in positions of vertices of substantially triangular shapes that imaginarily fill an aperture surface of the structural color filter in a planar way.

(4)

The solid-state imaging element according to (1) or (2), in which the periodic opening pattern in the structural color filter includes a plurality of opening portions each having an opening shape of a circular shape or a rectangular shape, and the respective opening portions are provided in positions of vertices of squares or rectangles that imaginarily fill an aperture surface of the structural color filter in a planar way.

(5)

The solid-state imaging element according to any one of (1) to (4), in which the structural color filter includes a metal film containing aluminum, copper, silver, gold, titanium, tungsten, or an alloy of these elements as a main component.

(6)

The solid-state imaging element according to any one of (1) to (5), in which a size of each of a plurality of opening portions included in the periodic opening pattern in the structural color filter is within a range of 50 nm to 500 nm, and a spacing between mutually adjacent ones of the opening portions is within a range of 100 nm to 1000 nm.

(7)

The solid-state imaging element according to any one of (1) to (6), in which a thickness of the metal film in the structural color filter is a thickness by which the metal film is optically opaque at a wavelength of light incident on the structural color filter.

(8)

The solid-state imaging element according to any one of (1) to (7), in which the thickness of the metal film in the structural color filter is within a range of 50 nm to 300 nm.

(9)

The solid-state imaging element according to any one of (1) to (8), in which the structural color filter is electrically grounded.

(10)

The solid-state imaging element according to any one of (1) to (9), in which a first light collecting lens structure is located between a surface on a side of the light receiving element of the structural color filter and the light receiving element, and a refractive index of the first light collecting lens structure has a value larger than a refractive index of a place around a place where the first light collecting lens structure is provided.

(11)

The solid-state imaging element according to (10), in which a surface shape of an aperture surface of the structural color filter is curved so as to be similar to a surface shape of the first light collecting lens structure.

(12)

The solid-state imaging element according to any one of (1) to (11), in which a second light collecting lens structure is located above a surface on an opposite side to the light receiving element of the structural color filter.

(13)

The solid-state imaging element according to any one of (1) to (12), in which a first light collecting lens structure is located between a surface on a side of the light receiving element of the structural color filter and the light receiving element, and a second light collecting lens structure is located above a surface on an opposite side to the light receiving element of the structural color filter, a refractive index of the first light collecting lens structure is a value larger than a refractive index of a place around a place where the first light collecting lens structure is provided, and a curvature of the second light collecting lens structure is larger than a curvature of the first light collecting lens structure.

(14)

The solid-state imaging element according to any one of (1) to (11), including:

a layer having a flat surface above a surface on an opposite side to the light receiving element of the structural color filter.

(15)

The solid-state imaging element according to any one of (1) to (14), further including:

an absorption-type color filter configured to absorb light of a prescribed wavelength, above the light receiving element.

(16)

The solid-state imaging element according to (15), in which the absorption-type color filter is a color filter configured to absorb light of a prescribed wavelength and selectively transmit light of a wavelength in a visible light region.

(17)

The solid-state imaging element according to (15), in which absorption-type color filters include a color filter configured to absorb light of a prescribed wavelength and selectively transmit light in a visible light region, and a white filter transparent to light in an electromagnetic wave wavelength region in which the light receiving element has sensitivity.

(18)

The solid-state imaging element according to any one of (15) to (17), in which the absorption-type color filter contains an organic-based material or an inorganic-based material.

(19)

A pupil correction method for a solid-state imaging element, the pupil correction method including:

arranging structural color filters each including a metal film provided with a periodic opening pattern with a structural period smaller than a prescribed wavelength, above at least part of a light receiving element of a solid-state imaging element, the solid-state imaging element including the light receiving element included in a plurality of pixels, and an interconnection layer located below the light receiving element and configured to acquire a signal of light detected by the light receiving element, in which the structural period is different between the structural color filters in accordance with a chief ray angle of incident light, and the structural period of the periodic opening pattern becomes smaller as the chief ray angle becomes larger, relative to the structural period of the periodic opening pattern at the chief ray angle of 0°.

(20)

An imaging device including at least:
a solid-state imaging element including
a light receiving element included in a plurality of pixels,
structural color filters located above at least part of the light receiving element and each including a metal film provided with a periodic opening pattern with a structural period smaller than a prescribed wavelength, and
an interconnection layer located below the light receiving element and configured to acquire a signal of light detected by the light receiving element,
in which the structural period is different between the structural color filters in accordance with a chief ray angle of incident light, and the structural period of the periodic opening pattern becomes smaller as the chief ray angle becomes larger, relative to the structural period of the periodic opening pattern at the chief ray angle of 0°; and
an optical system configured to guide light to the solid-state imaging element.

(21)

An information processing device including:
an imaging device including at least
a solid-state imaging element including
a light receiving element included in a plurality of pixels,
structural color filters located above at least part of the light receiving element and each including a metal film provided with a periodic opening pattern with a structural period smaller than a prescribed wavelength, and
an interconnection layer located below the light receiving element and configured to acquire a signal of light detected by the light receiving element,
in which the structural period is different between the structural color filters in accordance with a chief ray angle of incident light, and the structural period of the periodic opening pattern becomes smaller as the chief ray angle becomes larger, relative to the structural period of the periodic opening pattern at the chief ray angle of 0°, and
an optical system configured to guide light to the solid-state imaging element.

REFERENCE SIGNS LIST 10 pixel array section
20 vertical driving section
30 column processing section
40 horizontal driving section
50 system control section
60 signal processing section
70 data storage section
100 solid-state imaging element
101 light receiving element
103 pixel
111 interconnection layer
113 structural color filter
115 wavelength selection filter
117 flattening film
119 trench structure
121 light blocking section
123 light collecting element
125 in-layer lens

What is claimed is:

1. A solid-state imaging element comprising:
a light receiving element included in a plurality of pixels;
a structural color filter located above at least part of the light receiving element and the structural color filter including a metal film provided with a periodic opening pattern with a structural period smaller than a prescribed wavelength; and
a wavelength color filter stacked directly on a flattening film, wherein the flattening film is between the structural color filter and the wavelength color filter; and
an interconnection layer located below the light receiving element and configured to acquire a signal of light detected by the light receiving element, wherein the structural period is different between the structural color filter in accordance with a chief ray angle of incident light, and wherein the structural period of the periodic opening pattern becomes smaller as the chief ray angle becomes larger, relative to the structural period of the periodic opening pattern at the chief ray angle of 0°.

2. The solid-state imaging element according to claim 1, wherein the structural color filter is a structural filter utilizing surface plasmon polaritons generated at an interface between a metal surface and a dielectric.

3. The solid-state imaging element according to claim 2, wherein the periodic opening pattern in the structural color filter includes a plurality of opening portions each having an opening shape of a circular shape or a rectangular shape, and
wherein respective opening portions are provided in positions of vertices of substantially triangular shapes that imaginarily fill an aperture surface of the structural color filter in a planar way.

4. The solid-state imaging element according to claim 2, wherein the periodic opening pattern in the structural color filter includes a plurality of opening portions each having an opening shape of a circular shape or a rectangular shape, and
wherein respective opening portions are provided in positions of vertices of squares or rectangles that imaginarily fill an aperture surface of the structural color filter in a planar way.

5. The solid-state imaging element according to claim 1, wherein the metal film contains aluminum, copper, silver, gold, titanium, tungsten, or an alloy of these elements as a main component.

6. The solid-state imaging element according to claim 1, wherein a size of each of a plurality of opening portions included in the periodic opening pattern in the structural color filter is within a range of 50 nm to 500 nm, and
wherein a spacing between mutually adjacent ones of the plurality of opening portions is within a range of 100 nm to 1000 nm.

7. The solid-state imaging element according to claim 1, wherein a thickness of the metal film in the structural color filter is a thickness by which the metal film is optically opaque at a wavelength of light incident on the structural color filter.

8. The solid-state imaging element according to claim 7, wherein the thickness of the metal film in the structural color filter is within a range of 50 nm to 300 nm.

9. The solid-state imaging element according to claim 1, wherein the structural color filter is electrically grounded.

10. The solid-state imaging element according to claim 1,
wherein a first light collecting lens structure is located between a surface on a side of the light receiving element of the structural color filter and the light receiving element, and
wherein a refractive index of the first light collecting lens structure has a value larger than a refractive index of a place around a place where the first light collecting lens structure is provided.

11. The solid-state imaging element according to claim 10,
wherein a surface shape of an aperture surface of the structural color filter is curved so as to be similar to a surface shape of the first light collecting lens structure.

12. The solid-state imaging element according to claim 10,
wherein a second light collecting lens structure is located above a surface on an opposite side to the light receiving element of the structural color filter.

13. The solid-state imaging element according to claim 1,
wherein a first light collecting lens structure is located between a surface on a side of the light receiving element of the structural color filter and the light receiving element, and a second light collecting lens structure is located above a surface on an opposite side to the light receiving element of the structural color filter,
wherein a refractive index of the first light collecting lens structure is a value larger than a refractive index of a place around a place where the first light collecting lens structure is provided, and
wherein a curvature of the second light collecting lens structure is larger than a curvature of the first light collecting lens structure.

14. The solid-state imaging element according to claim 1, comprising:
a layer having a flat surface above a surface on an opposite side to the light receiving element of the structural color filter.

15. The solid-state imaging element according to claim 1, further comprising:
an absorption-type color filter configured to absorb light of the prescribed wavelength, above the light receiving element.

16. The solid-state imaging element according to claim 15,
wherein the absorption-type color filter is a color filter configured to absorb the light of the prescribed wavelength and selectively transmit light of a wavelength in a visible light region.

17. The solid-state imaging element according to claim 15, wherein the absorption-type color filter includes:
a color filter configured to absorb the light of the prescribed wavelength and selectively transmit light in a visible light region, and
a white filter transparent to light in an electromagnetic wavelength region in which the light receiving element has sensitivity.

18. The solid-state imaging element according to claim 15,
wherein the absorption-type color filter contains an organic-based material or an inorganic-based material.

19. A pupil correction method for a solid-state imaging element, the pupil correction method comprising:
arranging structural color filters each including a metal film provided with a periodic opening pattern with a structural period smaller than a prescribed wavelength, above at least part of a light receiving element of the solid-state imaging element, and
the solid-state imaging element including:
the light receiving element included in a plurality of pixels; wavelength color filters stacked directly on a flattening film, wherein the flattening film is between the structural color filters and the wavelength color filters; and
an interconnection layer located below the light receiving element and configured to acquire a signal of light detected by the light receiving element, wherein the structural period is different between the structural color filters in accordance with a chief ray angle of incident light, and wherein the structural period of the periodic opening pattern becomes smaller as the chief ray angle becomes larger, relative to the structural period of the periodic opening pattern at the chief ray angle of 0°.

20. An imaging device comprising at least:
a solid-state imaging element including:
a light receiving element included in a plurality of pixels;
structural color filters located above at least part of the light receiving element and each including a metal film provided with a periodic opening pattern with a structural period smaller than a prescribed wavelength;
wavelength color filters stacked directly on a flattening film, wherein the flattening film is between the structural color filters and the wavelength color filters; and
an interconnection layer located below the light receiving element and configured to acquire a signal of light detected by the light receiving element, wherein the structural period is different between the structural color filters in accordance with a chief ray angle of incident light, and wherein structural period of the periodic opening pattern becomes smaller as the chief ray angle becomes larger, relative to the structural period of the periodic opening pattern at the chief ray angle of 0° ; and
an optical system configured to guide the light to the solid-state imaging element.

21. An information processing device comprising:
an imaging device including at least:
a solid-state imaging element including:
a light receiving element included in a plurality of pixels;
structural color filters located above at least part of the light receiving element and each including a metal film provided with a periodic opening pattern with a structural period smaller than a prescribed wavelength;
wavelength color filters stacked directly on a flattening film, wherein the flattening film is between the structural color filters and the wavelength color filters; and
an interconnection layer located below the light receiving element and configured to acquire a signal of light detected by the light receiving element,
wherein the structural period is different between the structural color filters in accordance with a chief ray angle of incident light, and wherein the structural period of the periodic opening pattern becomes smaller as the chief ray angle becomes larger, relative to the structural period of the periodic opening pattern at the chief ray angle of 0°; and
an optical system configured to guide the light to the solid-state imaging element.

* * * * *